(12) United States Patent
Sato et al.

(10) Patent No.: US 11,726,403 B2
(45) Date of Patent: Aug. 15, 2023

(54) INFORMATION PROCESSING APPARATUS, INFORMATION PROCESSING METHOD, AND COMPUTER PROGRAM

(71) Applicant: CANON KABUSHIKI KAISHA, Tokyo (JP)

(72) Inventors: Toshiyuki Sato, Utsunomiya (JP); Sentaro Aihara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 377 days.

(21) Appl. No.: 17/061,923

(22) Filed: Oct. 2, 2020

(65) Prior Publication Data

US 2021/0109441 A1    Apr. 15, 2021

(30) Foreign Application Priority Data

Oct. 11, 2019    (JP) ................................ 2019-187550

(51) Int. Cl.
*G03F 7/00*    (2006.01)
*G06T 7/00*    (2017.01)

(52) U.S. Cl.
CPC ............ *G03F 7/0002* (2013.01); *G06T 7/001* (2013.01); *G06T 2207/30141* (2013.01); *G06T 2207/30148* (2013.01)

(58) Field of Classification Search
CPC ...... G03F 7/0002; G03F 7/7065; G03F 7/161; G06T 7/001; G06T 2207/30141; G06T 2207/30148

See application file for complete search history.

(56) References Cited

U.S. PATENT DOCUMENTS

| 10,493,672 | B2 | 12/2019 | Aihara | |
|---|---|---|---|---|
| 2012/0072003 | A1 | 3/2012 | Matsuoka | |
| 2016/0129614 | A1* | 5/2016 | Yamazaki | G03F 7/0002 264/293 |

FOREIGN PATENT DOCUMENTS

| JP | 2011161832 A | | 8/2011 |
|---|---|---|---|
| JP | 2012069701 A | | 4/2012 |
| JP | 2015035509 A | * | 2/2015 |
| JP | 2018195811 A | | 12/2018 |

(Continued)

*Primary Examiner* — Edward F Urban
*Assistant Examiner* — Wassim Mahrouka
(74) *Attorney, Agent, or Firm* — Rossi, Kimms & McDowell LLP

(57) ABSTRACT

In order to provide an information processing apparatus in which a correction work time for coating information is shortened, an information processing apparatus for an imprint apparatus configured to perform an imprint process of forming a pattern on an imprint material (R) on a substrate (W) using a mold on the basis of coating information indicating a position of the imprint material (R) includes: at least one processor or circuit which function as: an obtaining unit configured to obtain inspection information regarding a result of an inspection of the substrate (W) which has been subjected to the imprint process; an analysis unit configured to analyze the inspection information and obtain analysis information associated with the result of the imprint process; and a display control unit configured to display at least any of the inspection information and the analysis information on a screen of a display apparatus at the same time with the coating information.

20 Claims, 21 Drawing Sheets

(56) References Cited

FOREIGN PATENT DOCUMENTS

| JP | 2019009420 A | 1/2019 |
|----|--------------|--------|
| WO | 2011004534 A1 | 12/2012 |

* cited by examiner

INFORMATION PROCESSING APPARATUS, INFORMATION PROCESSING METHOD, AND COMPUTER PROGRAM

BACKGROUND OF THE INVENTION

Field of the Invention

The present invention relates to an information processing apparatus, an information processing method, and a computer program.

Description of the Related Art

There are imprint techniques for forming a fine pattern by bringing a mold having a fine pattern (concave and convex pattern) formed therein (transferred) into contact with an imprint material for example, a photocurable resin) supplied onto a substrate, Imprint techniques have been attracting attention as one of nanolithography technologies for mass production of semiconductor devices and magnetic storage media. One imprint technique is a photocuring method in which a photocurable resin is used as the imprint material. The imprint apparatus in which this photocuring method is adopted first supplies (applies) the imprint material onto a substrate. Subsequently, the imprint material is subjected to a curable process by irradiating, light such as ultraviolet, rays in a state where the mold having a pattern is in contact with the imprint material. Then, the pattern remains on the substrate after releasing the mold from the cured imprint material.

Also, in an imprint apparatus, when a resin as the imprint material is supplied onto a substrate, for example, an array of liquid droplets of the imprint material may be formed on the substrate using an inkjet method. Furthermore, when liquid droplets of the imprint material on the substrate are brought into contact with a mold, the imprint material fills (enters) concave portions of the pattern of the mold. Here, in the imprint apparatus, a defect in a pattern to be formed on the substrate may occur due to a defect pattern of the mold, manufacturing errors, and operational errors of the apparatus in some cases and it is not easy to form quality patterns at all times. In order to prevent such problems, techniques for optimizing a drop recipe (an imprint recipe) as coating information (la coating pattern) indicating supply positions on a substrate for liquid droplets of a resin have been proposed.

Japanese Patent Laid-Open No. 2012-69701 proposes a method of inspecting for defects in a pattern transferred onto a substrate and generating a new drop recipe by reflecting outline information of defects on pattern data when defects are present.

Japanese Patent Laid-Open No. 2018-195811 proposes a method of repeatedly performing modification of a drop recipe until a pattern transferred on a substrate satisfies quality conditions.

Japanese Patent Laid-Open No. 2019-009420 proposes a method of comparing and displaying a drop recipe and a drop recipe to be predicted through parameter settings of the imprint apparatus.

A method of performing, using an algorithm, extracting information concerning a defect in a drop recipe to be used in an imprint process in the related art, adding the information concerning the defect to the drop recipe and calculating correction data for readjustment of the drop recipe has also been proposed. However, sufficient accuracy has not been obtained yet and the method has not been put to practical use. Furthermore, a drop, recipe used in an imprint process is generated by setting conditions such as design information concerning a mold and a thickness of a thin film formed on a substrate. The drop recipe generated in such a manner does not take into account the influence of differences in imprint control method when the imprint process is actually performed, an influence of the atmosphere with which the imprint material comes into contact, and the like. For this reason, as described above, variations occur in the filling (entering) of the imprint material and many defects may be generated. A method of capturing a pattern on a substrate which has been subjected to an imprint process, checking for defects in the pattern on the substrate from the image data, and adjusting a drop recipe is performed to deal with this problem. However, in this method, it takes a lot of time to adjust the drop recipe.

Therefore, an object of the present invention is to provide, for example, an information processing apparatus in which the working time for correction of coating information is able to be shortened.

SUMMARY OF THE INVENTION

In order to achieve the above object, an information processing apparatus for an imprint apparatus configured to perform an imprint process of forming a pattern on an imprint material on a substrate using a mold on the basis of coating information indicating a position of the imprint material includes: at least one processor or circuit which functions as: an obtaining unit configured to obtain inspection information regarding a result of an inspection of the substrate which has been subjected to the imprint process; an analysis: unit configured to analyze the inspection information and obtain analysis information associated with the results of the imprint process; and a display control unit configured to display at least any of the inspection information and the analysis information on a screen of a display apparatus at the same time with the coating information.

Further features of the present invention will become apparent from the following description of exemplary embodiments with reference to the attached drawings.

DESCRIPTION OF THE EMBODIMENTS

Figure 1:
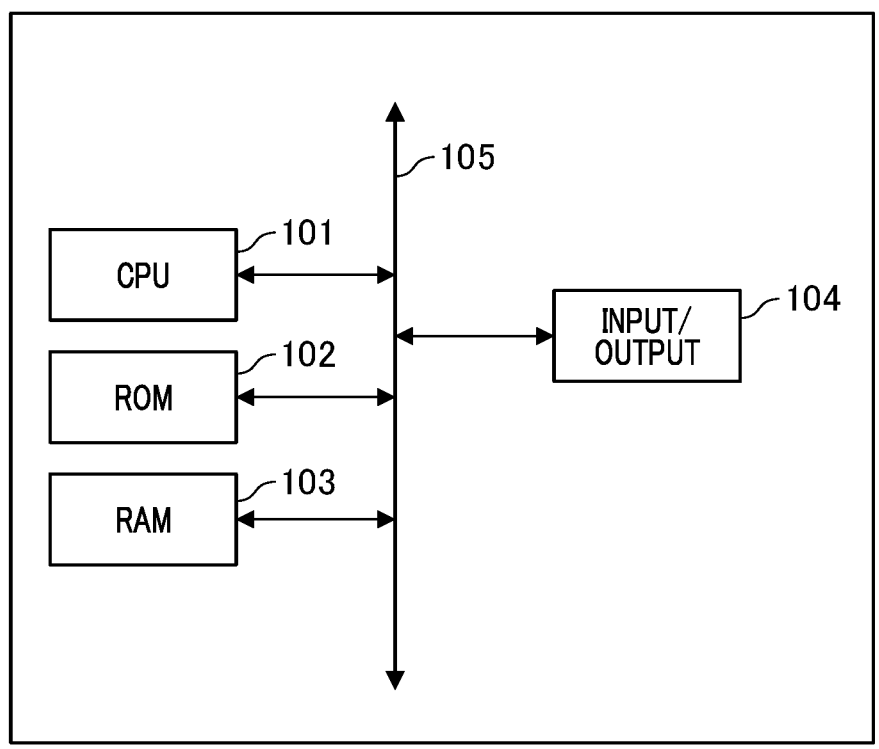
FIG. 1 is a diagram illustrating an example of a hardware configuration of an information processing apparatus according to an embodiment.

Preferred embodiments of the present invention will be described below using examples with reference to the accompanying drawings. In each drawing, the same members or constituent elements will be denoted by the same reference numerals and the repeated description thereof will be omitted or simplified.

Embodiment 1

FIG. 1 is an example of a configuration diagram of hardware in which an information processing apparatus according to this embodiment is installed A configuration in which a central processing unit (CPU) 101, a read only memory (ROM) 102, a random access memory (RAM) 103, and an input/output 104 to/from an external storage apparatus or the like which are interconnected through a bus 105 are included is provided. The input output 104 receives an input as an input signal from an external apparatus (an imaging apparatus, an operating apparatus, or the like) in a format in which the input can be processed using the information processing apparatus and outputs an output as an output signal to an external apparatus (a display apparatus or the like) in a format in which the output can be processed.

Figure 2:
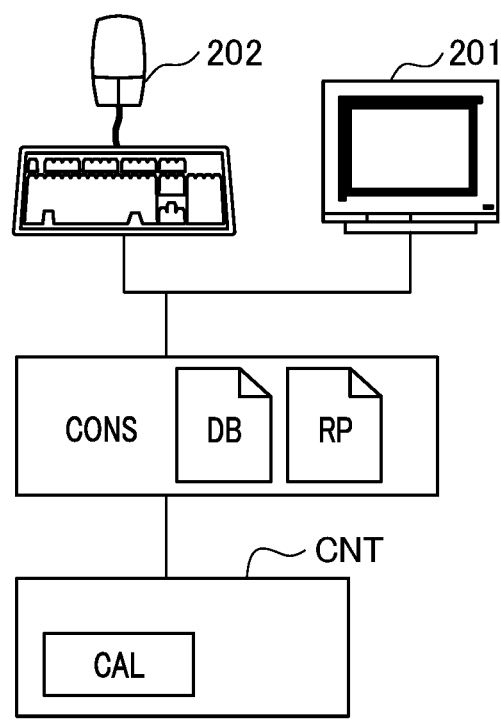
FIG. 2 is a diagram illustrating an example of a configuration of the information processing apparatus according to the embodiment.

FIG. 2 is an example of a diagram illustrating a configuration of the information processing apparatus according to this embodiment. The information processing apparatus may include a controller CNT, a console unit CONS, a monitor 201, and an input device 202.

Figure 3:
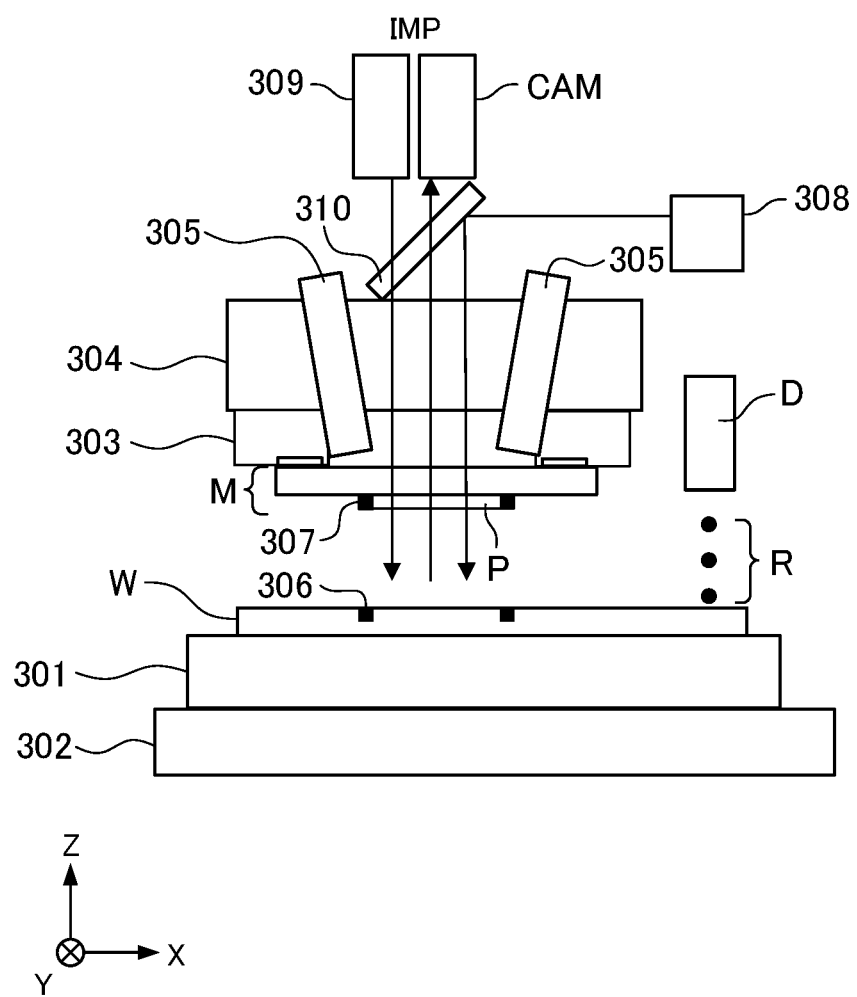
FIG. 3 is a diagram illustrating an example of the imprint apparatus according to the embodiment.

The controller CNT controls operations or the like of constituent elements of an imprint apparatus IMP in FIG. 3, for example, a substrate stage 302, a mold stage 304, and a dispenser D. The controller CNT has a configuration as shown in FIG. 1 and is connected to each constituent element of the imprint apparatus IMP through a (wired or wireless) line. The method according so this embodiment is executed using a computer as a program. The controller CNT functions as a control unit.

The console unit CONS generates and manages, for example, an operation screen (an editing screen) such as an editor DAE which functions as a user interface. Furthermore, the console unit CONS manages, for example, a database DB and coating information (a coating pattern) RP of an imprint material R. The monitor 201 is a display apparatus configured to display an operation screen and also functions as a display unit. The input device 202 is, for example, a keyboard or a mouse.

FIG. 3 illustrates the imprint apparatus IMP in this embodiment. The imprint apparatus IMP in this embodiment is configured to form a pattern in a plurality of shot regions of a substrate W by repeatedly performing the imprint process. Here, the imprint process refers to a series of cycles which includes supply of the imprint material R to the substrate W, contact between a mold M and the imprint material R, filling of a pattern of the mold M with the imprint material R, positioning (alignment), curing (exposure), and releasing of the mold M. The imprint material R may be an ultraviolet curable resin which is cured through irradiation with ultraviolet rays or the imprint material R may be a thermoplastic or thermosetting resin.

The imprint apparatus IMP in this embodiment includes a substrate chuck 301 (a substrate holding section) configured to hold the substrate W, the substrate stage 302, a mold chuck 303 (a mold holding section), and the mold stage 304 (a mold driving section). The dispenser D (a supply section), an alignment scope 305, a light source 308, a detection light source 309, and a mirror 310 may also be included.

The substrate chuck 301 holds the substrate W. The substrate chuck 301 holds the substrate W using, for example, a vacuum suction pad or the like. The substrate stage 302 holds the substrate chuck 301 and is driven by a drive mechanism (not shown) to move the substrate W in six axes, thereby performing positioning between the substrate W and the mold M. The drive mechanism may be constituted of a plurality of drive mechanisms such as a coarse drive mechanism and a fine drive mechanism. The substrate W is a substrate to which a concave and convex pattern is transferred, which includes, for example, a single crystal silicon substrate, a silicon on insulator (SOI) substrate, and the like.

The mold chuck 303 holds a mold (a mould or a mask) M having a pattern (a pattern section) P formed therein. The mold M is held using the mold chuck 303 through, for example, a vacuum suction force, an electrostatic force, or the like. The mold stage 304 holds the mold chuck 303 and drives the mold chuck 303 using a drive mechanism (not shown). For example, the mold M has a rectangular outer circumferential portion, has a predetermined concave and convex pattern formed three-dimensionally on a surface thereof facing the substrate W, and is made of a material through which ultraviolet rays are transmitted (such as quartz).

The dispenser D may include, for example, a tank configured to accommodate the imprint material R, nozzles N through which the imprint material R to be supplied from the tank through a supply path is ejected to the substrate W, a valve provided in the supply path, and a supply amount controller. For example, the supply amount controller controls the valve so that one shot region is coated with the imprint material R in one ejection operation of the imprint material R, thereby controlling an amount of imprint material to be supplied to the substrate W. The dispenser D functions as a supply unit of the imprint material R.

The alignment scope 305 is fixed to the mold stage 304 and detects an alignment mark (a substrate-side mark 306) formed on the substrate W and an alignment mark (a mold-side mark 307) formed on the mold M. The substrate-side mark 306 is formed in a shot region on the substrate W and the mold-side mark 307 is formed in a pattern P of the mold M. A calculation unit CAL in the controller CNT obtains a relative positional deviation between the mold M and the substrate W from the detection results of the substrate-side mark 306 and the mold-side mark 307 detected by the alignment scope 305.

The controller CNT drives the substrate stage 302 and the mold stage 304 on the basis of the result of the obtained relative positional deviation and corrects a relative positional deviation between the mold M and the substrate W. The relative positional deviation is not limited to a shift component and also includes errors in a magnification and a rotation component. It is possible to correct a shape of the pattern P of the mold M in accordance with a shot region formed on the substrate W. As a method of detecting the substrate-side mark 306 and the mold-side mark 307, it is possible to use an is signal such as a moiré signal obtained by reflecting relative positions of the two marks. Furthermore, the relative positions of the two marks may be obtained by detecting an image of each mark.

The light source 308 is a light source configured to emit (radiate, or allow illumination with) exposure light (ultraviolet rays) and the detection light source 309 is a light source for detection configured to emit detection light. The mirror 310 is a dichroic mirror and has a characteristic in which the mirror 310 reflects exposure light and exposure light is transmitted through the mirror 310. The exposure light from the light source 308 is reflected by the mirror 310 and is radiated to the imprint material R to cure the imprint material R. Thus, the pattern P of the mold M is formed (transferred) on the substrate W.

The detection light from the detection light source 309 is transmitted through the mirror 310, the mold stage 304, and the mold chuck 303 and illuminates a shot region on the substrate W. The light which illuminates the shot region is reflected by a surface of the substrate W and a pattern surface of the mold M and is detected by an imaging unit CAM using reflected light from the substrate W and reflected light from the mold M as detection light. When the detection light detected by the imaging unit CAM is displayed on the monitor 201, an operator can observe a state of the imprint process. Furthermore, an image obtained by the imaging unit CAM is treated as inspection information regarding a result of an inspection of the substrate which has been subjected to the imprint process.

Figure 4:
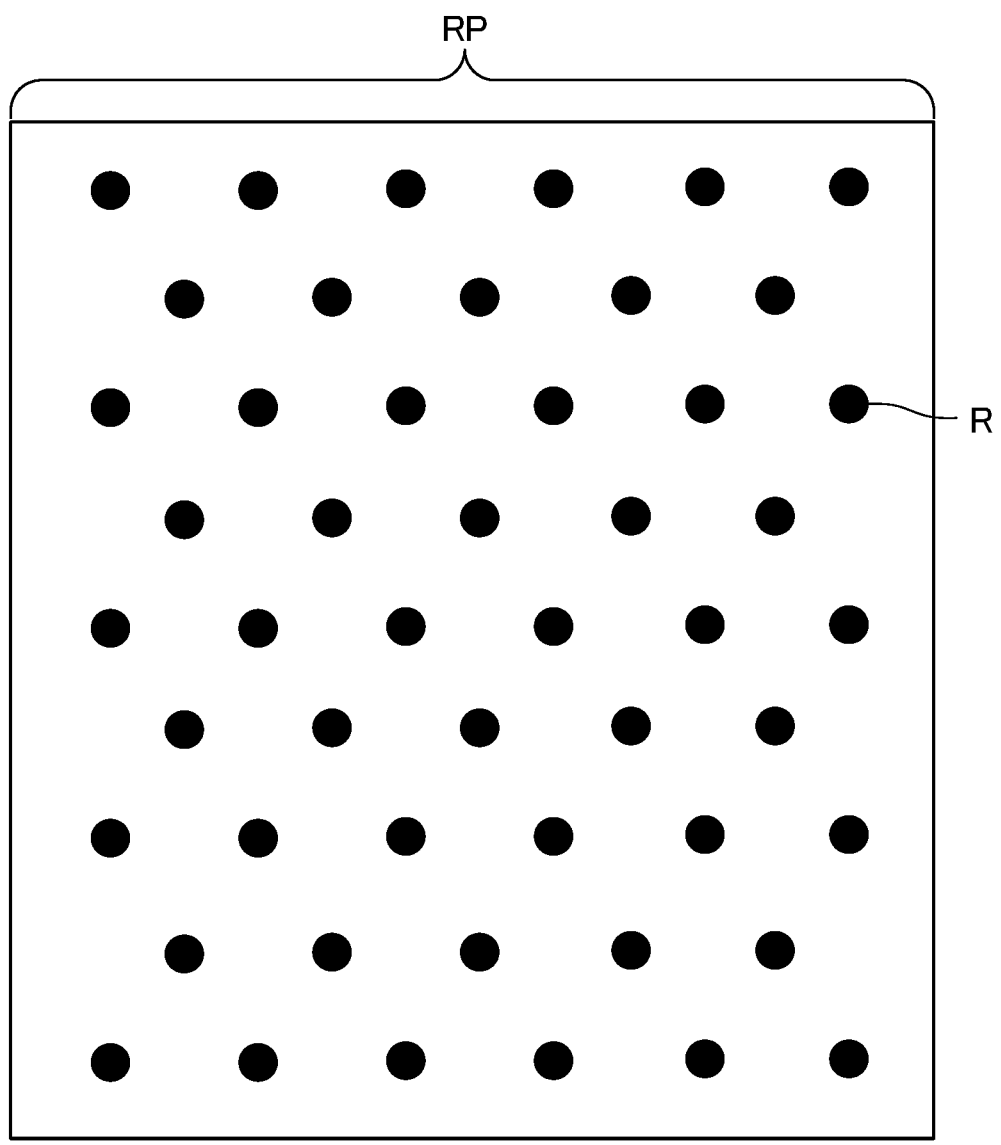
FIG. 4 is a diagram illustrating coating information obtained from a drop recipe.

FIG. 4 is a diagram of coating information (a coating pattern) RP of the imprint material R to be managed by the console unit CONS. In the coating information RP, coordinates indicating a position and an amount when the imprint material R is to be supplied to the substrate W are set (described) as a drop recipe. The controller CNT controls the substrate stage 302 and the dispenser D so that the imprint material R is supplied to a position set iii the coating information RP on the substrate W.

Figure 5:
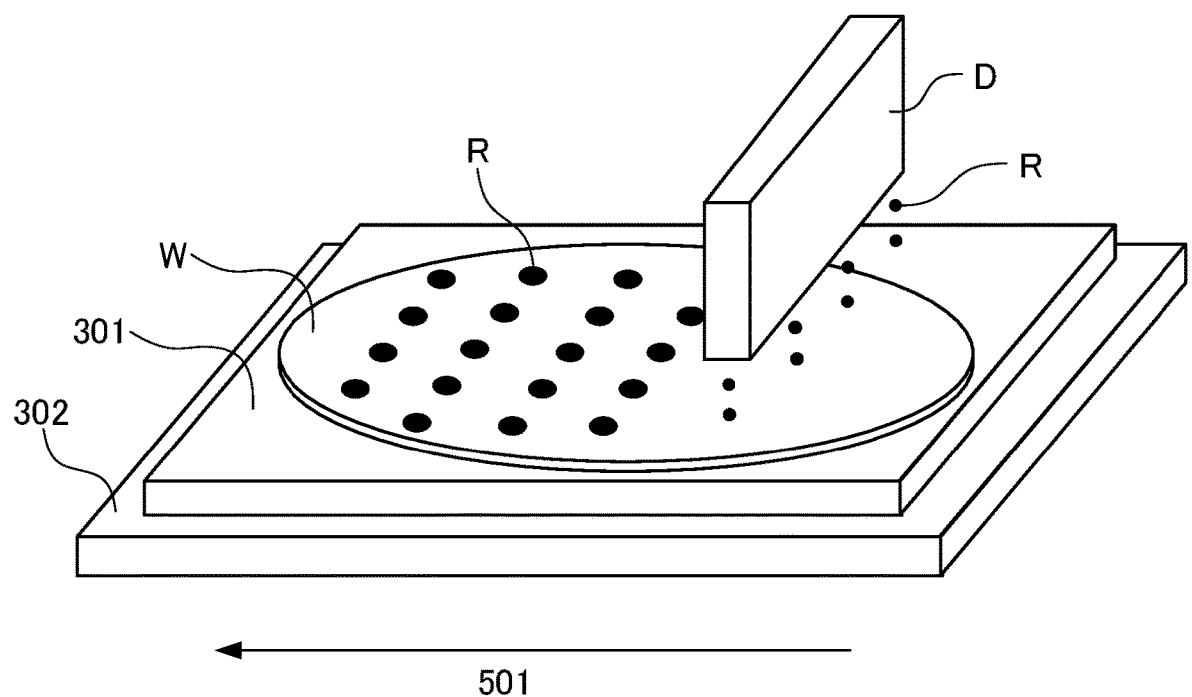
FIG. 5 is a diagram illustrating an operation of applying the imprint material according to Embodiment 1.

FIG. 5 is a diagram illustrating a state in which the imprint material R is supplied (applied) on the substrate W on the basis of coordinate information of the coating information RP illustrated in FIG. 4. The controller CNT controls the substrate stage 302 such that the substrate stage 302, for example, is moved in a direction of an arrow 501. Furthermore, the imprint material R is supplied on the substrate W by ejecting the imprint material R on the basis of the coordinate information of the coating information RP from the plurality of nozzles N arranged side by side in the dispenser D. In a method of supplying the imprint material R on the substrate W, instead of moving the substrate stage 302 the imprint material R may be ejected while moving the dispenser D or the substrate stage 302 and the dispenser D may be moved relative to each other.

After the substrate W is coated with the imprint material R on the basis of the coating information RP, a concave portion in the pattern P of the mold M is filled with the imprint material R by bringing the mold M into contact with the imprint material R supplied to the substrate W (imprinting or pattern formation).

A recessed portion having a region larger than that of the pattern P is present in a surface opposite to a surface of the pattern P at a center of the mold chuck 303 and is closed using the mold and seal glass not shown), A pressure controller (not shown) is connected to the closed space (a cavity portion) and can control a pressure of the closed space.

When the mold M is deformed into a convex shape by increasing the pressure of the cavity portion at the time of imprinting it is possible to prevent air bubbles from being trapped between the substrate W and the mold M at the time of imprinting. If the imprint material on the substrate W comes into contact with the mold M, the pressure of the cavity portion is restored and the imprint material on the substrate W is fully brought into contact with the pattern P of the mold M. Furthermore, after the contact, a pattern is formed in the imprint material R in a predetermined pattern region of the substrate W by curing the imprint material through irradiation of light with a predetermined wavelength. After that, the mold Ni is separated from the cured imprint material R. Thus, a three-dimensional pattern (concave and convex pattern) is formed on the substrate W.

Figure 6:
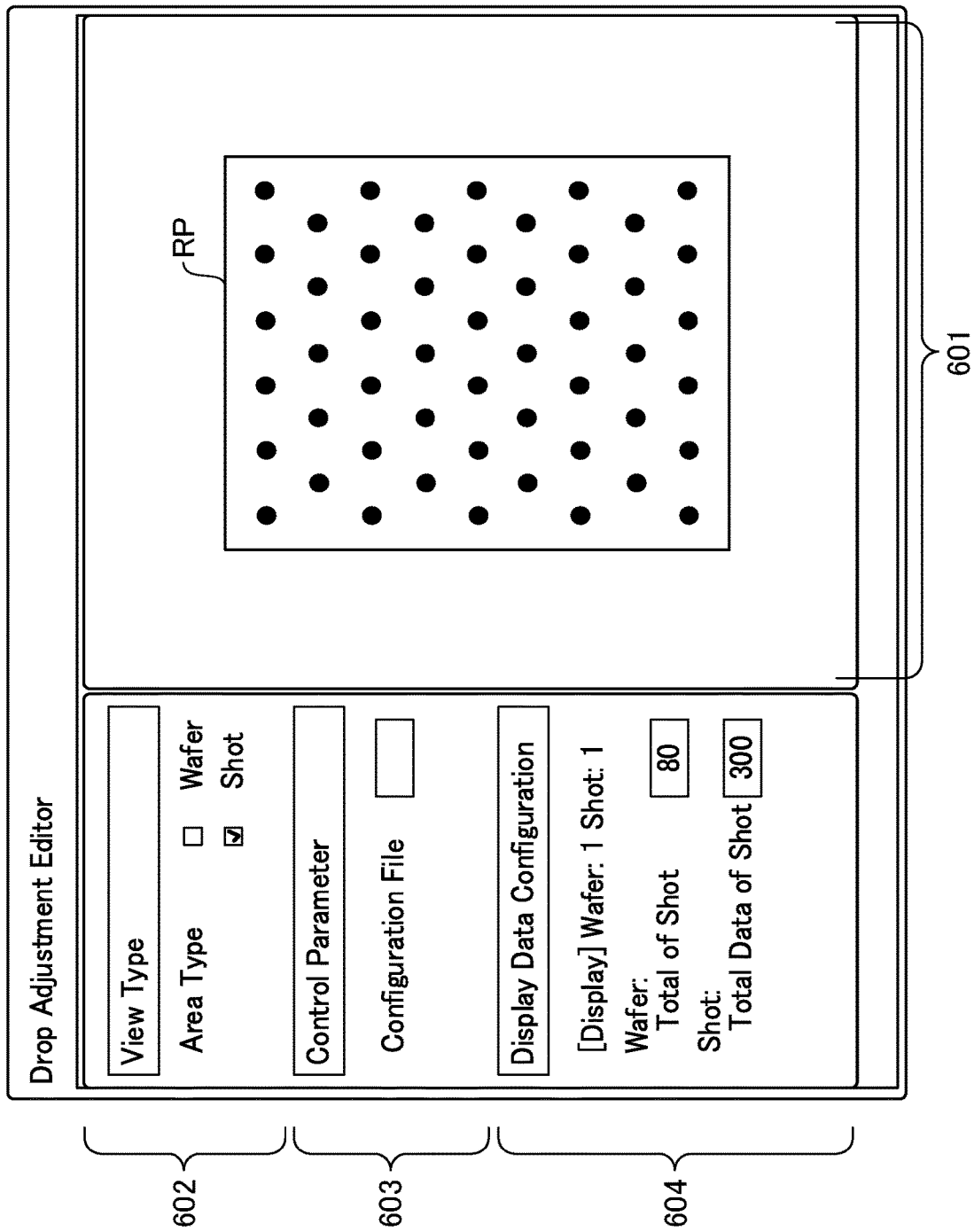
FIG. 6 is a diagram illustrating an editor for displaying information according Embodiment 1.

FIG. 6 is a diagram illustrating an editor drop adjustment editor (DAE) in this embodiment. The editor DAE is displayed on the monitor 201. A program for operating the editor DAE may be included in the information processing apparatus as described in this embodiment. In addition, the program may be provided in a computer not shown) connected through a wired or wireless communication line outside of the information processing apparatus or the imprint apparatus IMP.

As will be described later with reference to FIG. 17, the editor DAE obtains inspection information (inspection data) concerning the entire substrate W which has been subjected to the imprint process and extracts characteristics (characteristic amounts) by performing image analysis. Here, the inspection information is, for example, an image obtained by the imaging unit CAM and includes image information of the pattern P formed on the substrate which has been subjected to the imprint process. Furthermore, analysis information associated with the result of the imprint process is obtained by analyzing the obtained inspection information. Here, the analysis information is, for example, defect information associated with a defect in the substrate W which has been subjected to the imprint process.

The analysis information is obtained by analyzing a type, a size, a shape, or the like of a defect using the inspection information and obtaining information concerning the defect. Furthermore, the analysis information may be obtained on the basis of the inspection information and information indicating the spread of liquid droplets (drops) of the imprint material, that is, filling information for the pattern of the mold M may be generated as the analysis information. In addition, correction information for correcting the coating information is calculated on the basis of the analysis information obtained by analyzing the obtained inspection information.

Also, in the editor DAE, in addition to the coating information RP indicating the position and the amount of the imprint material R to be supplied on the substrate W, at least one or more of the inspection information, the analysis information, and the correction information is displayed in an area 601 at the same time. The editor DAF also functions as a display unit configured to display these pieces of information. Furthermore, these pieces of information are also displayed on the monitor 201 which is a display apparatus. When these pieces of information are displayed in the area 601, in addition to the coating information RP, there is a characteristic in that at least one or more of the inspection information, the analysts information, and the correction information is displayed in the area 601 so that these pieces of information partially overlap.

Furthermore, at least any two or more of the coating information RP, the inspection information, the analysis information, and the correction information may be displayed in the area 601. In addition, at east any two or more may be displayed by, for example, providing another display apparatus, in addition to the monitor 201, connecting the other display apparatus to the monitor 201 through a (wired or wireless) line, and linking the coating information RP, the inspection information, the analysis information, and the correction information together.

Also, an area 602 in which a parameter for switching whether the display content of the area 601, for example, the entire substrate is displayed or a shot region is displayed can be set is provided. Furthermore, an area 603 in which a parameter for a configuration information file (a configuration file) or the like configured to obtain inspection information after imprinting can be set is provided. Moreover, information obtained from the configuration information file is displayed in an area 604. In the configuration information file, for example, information such as the coating information RP, the inspection information, and the analysis information is automatically linked using the controller CNT. Furthermore, the configuration information file is generated using the controller CNT as an example.

Therefore, the controller CNT also functions as a unit configured to generate a configuration information file. Offsets and magnifications for displaying, in the editor, inspection data necessary for performing displaying in the editor DAE are written in the configuration information file. Furthermore, coordinate information on a shot region of the inspection information (position information), a place in which inspection information is present, and the like are recorded (stored) in the configuration information file. In addition, coordinate information (position information) of a defect portion in the analysis information, coordinates (a position) of a corrected place which has been subjected to correction in the correction information, offsets and magnification information for displaying inspection information necessary for performing displaying in the editor DAE in the editor DAE, and the like are also recorded (stored).

The pieces of information stored in the configuration information file are stored in separate files, and as described above, information in which the configuration information file links the pieces of information with each other is stored in the configuration information file. The editor DAE obtains the inspection information, the analysis information, the correction information, and the like from the configuration information file designated in the area 603, in addition to the coating information RP, and as described above, associates at least one of the inspection information, the analysis information, the correction information, and the like, in addition to the coating information RP and performs displaying. The configuration information file may include information concerning an inspection apparatus configured to inspect the substrate which has been subjected to imprinting and a part of the substrate W or the entire substrate.

Also, the editor DAE has a function of changing the number of pieces of data of information used for performing displaying when the displaying is performed on the monitor 201. When the editor DAE displays a list of image data which can be displayed from the configuration information file and a user selects image data to be displayed from the displayed list of image data, the editor DAE displays the image data selected by the user. As a method of selecting the image data of the user, individual image data may be used or a group obtained by performing division using coordinate information may be used.

Figure 7:
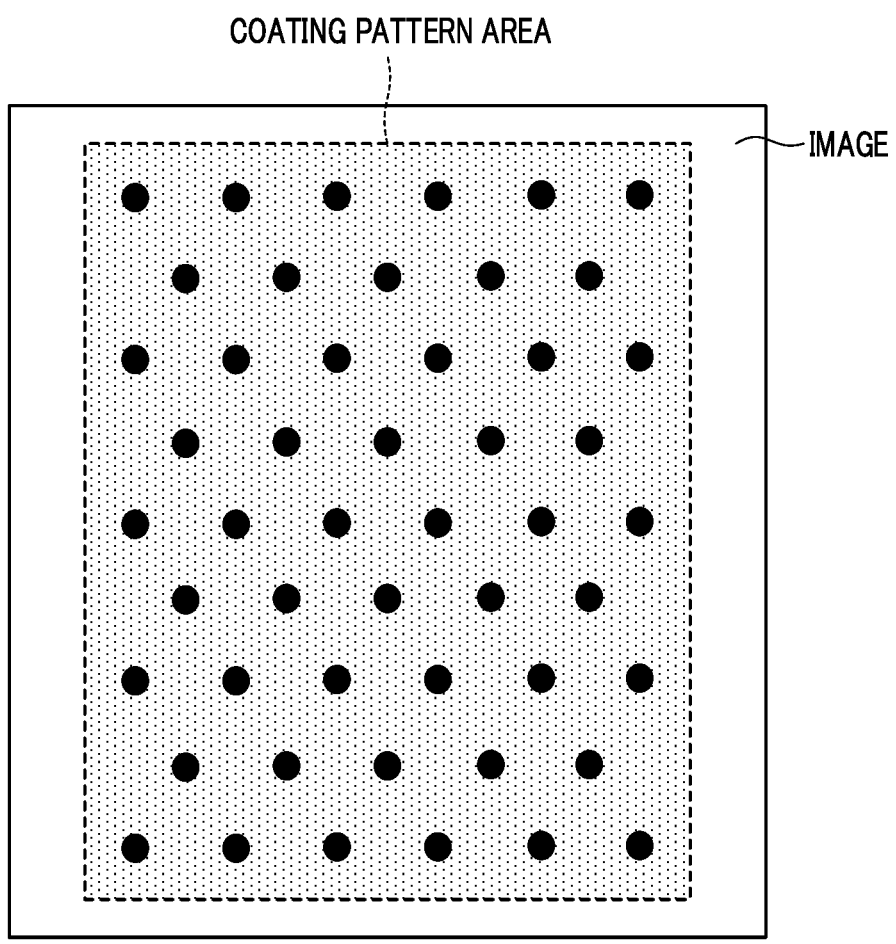
FIG. 7 is a diagram illustrating a display method when one piece of inspection information is present for the entire shot region according to Embodiment 1.
Figure 8:
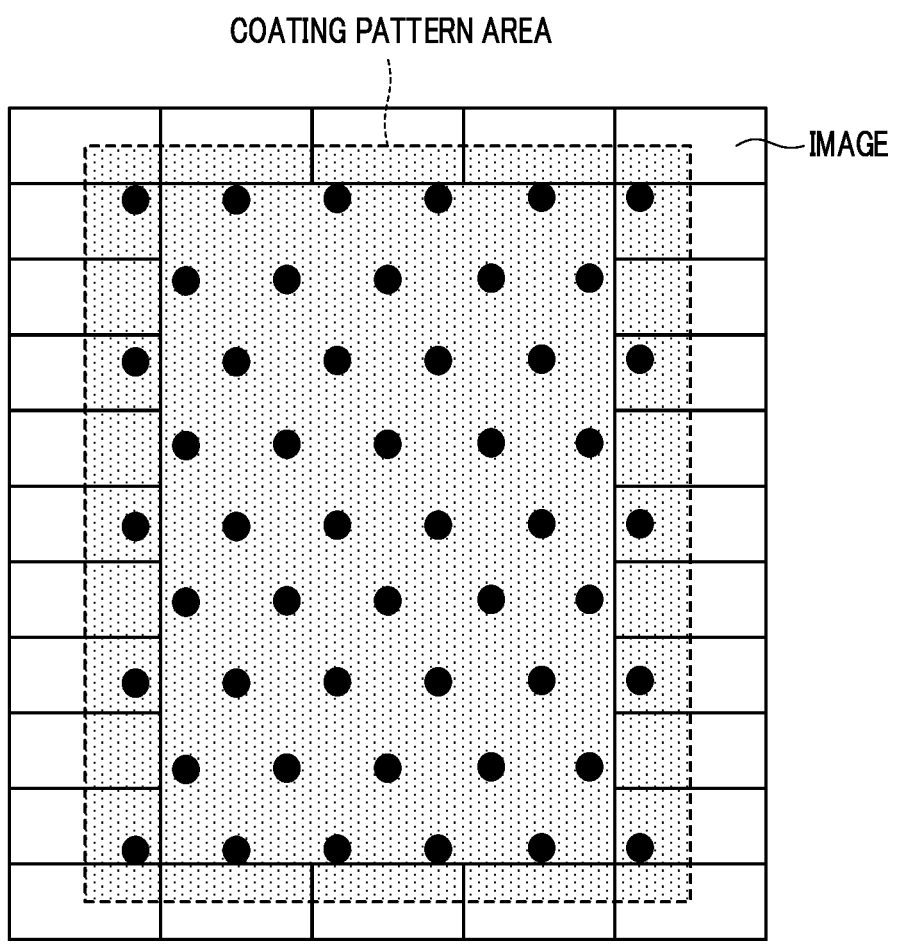
FIG. 8 is a diagram illustrating a display method when a plurality of pieces of inspection information are present on an outer circumference of a shot region according to Embodiment 1.

FIG. 7 is a diagram illustrating a case in which the coating information RP and the inspection information are displayed at the same time when one piece of inspection information is present on the entire surface of a shot region. FIG. 8 is a diagram illustrating a case in which the coating information RP and the plurality of pieces of inspection information are displayed at the same time when a plurality of pieces of inspection information of a pattern formed on the substrate which has been subjected to the imprint process are present with respect to an outer circumference of a shot region. A coating pattern area in FIGS. 7 and 8 is an area to which the imprint material R is supplied on the basis of the coating information RP. The same applies to the coating pattern area in FIGS. 9 to 16 which will be described later.

In this embodiment, the editor DAE obtains information to be linked from the configuration information file. The information to be obtained is the coordinate information of the coating information RP and the coordinate information of the inspection information. Furthermore, after positioning is performed on the basis of the coordinate information of the coating information RP and the coordinate information of the inspection information, the positioning is reflected in the area 601 in the editor DAE. After that, the pieces of information are displayed on the monitor 201. When the pieces of information are displayed on the area 601 and the monitor 201, the pieces of information are displayed at the same time. When the pieces of information are displayed at the same time, the pieces of information may be displayed on the monitor 201 while partially overlapping or may be displayed separately on the same screen, for example, may be displayed to be arranged side by side upward/downward or rightward/leftward. Alternatively, another display apparatus may be provided and display be performed on each display apparatus or information to be displayed on each display apparatus may be arbitrarily combined and displayed.

The one piece of inspection information as shown in FIG. 7 may be provided or the plurality of pieces of inspection information as shown in FIG. 8 may be provided. Furthermore, the inspection information is not limited to the information concerning an outer circumference of the substrate W and may be information concerning an inner circumference of the substrate W or may be inspection information in an arbitrary shot region. In addition, the inspection information may be obtained using an inspection apparatus which inspects a substrate or the like installed outside of the imprint apparatus. Moreover, inspection information stored in a storage apparatus such as a file server may be used as the inspection information. The storage apparatus also functions as a storage unit. In this way, when the coating information RP and the inspection information are displayed on the monitor 201 at the same time, it is, possible to significantly reduce a work time for the user to adjust (correct) the coating information RP at the time of performing the next imprint process.

Embodiment 2

Figure 9:
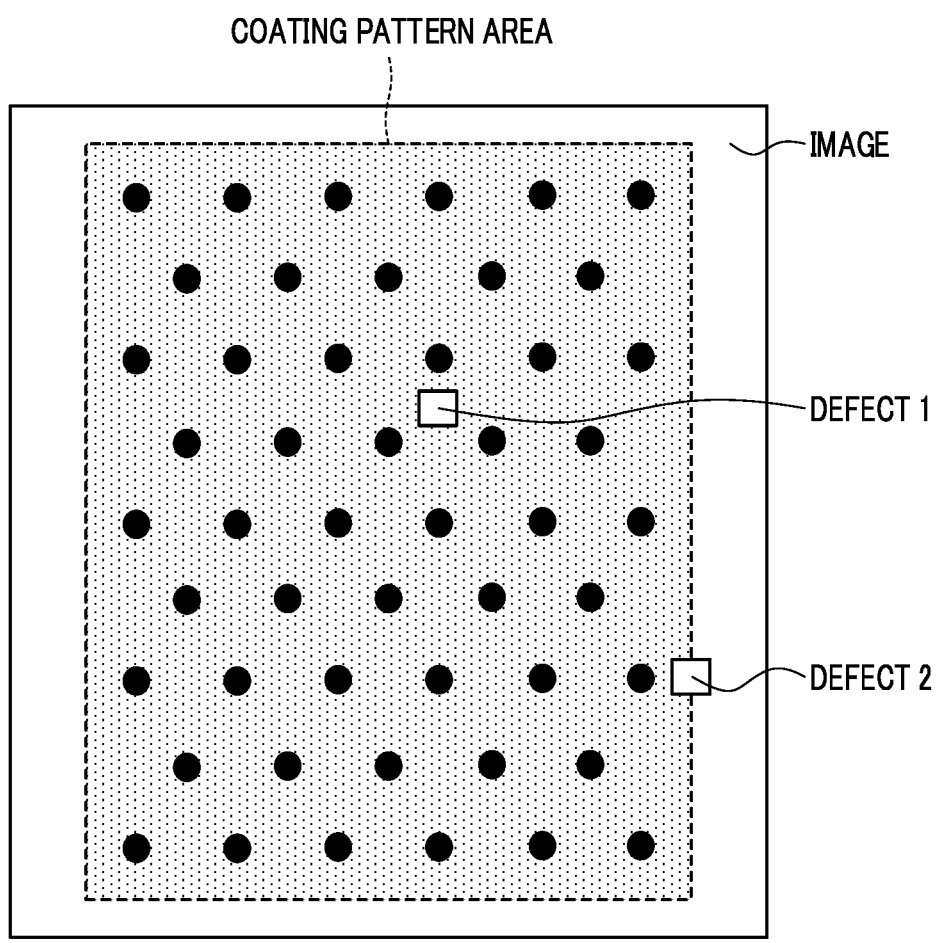
FIG. 9 is a diagram illustrating a display method when one piece of inspection information is present for the entire shot region according to Embodiment 2.
Figure 10:
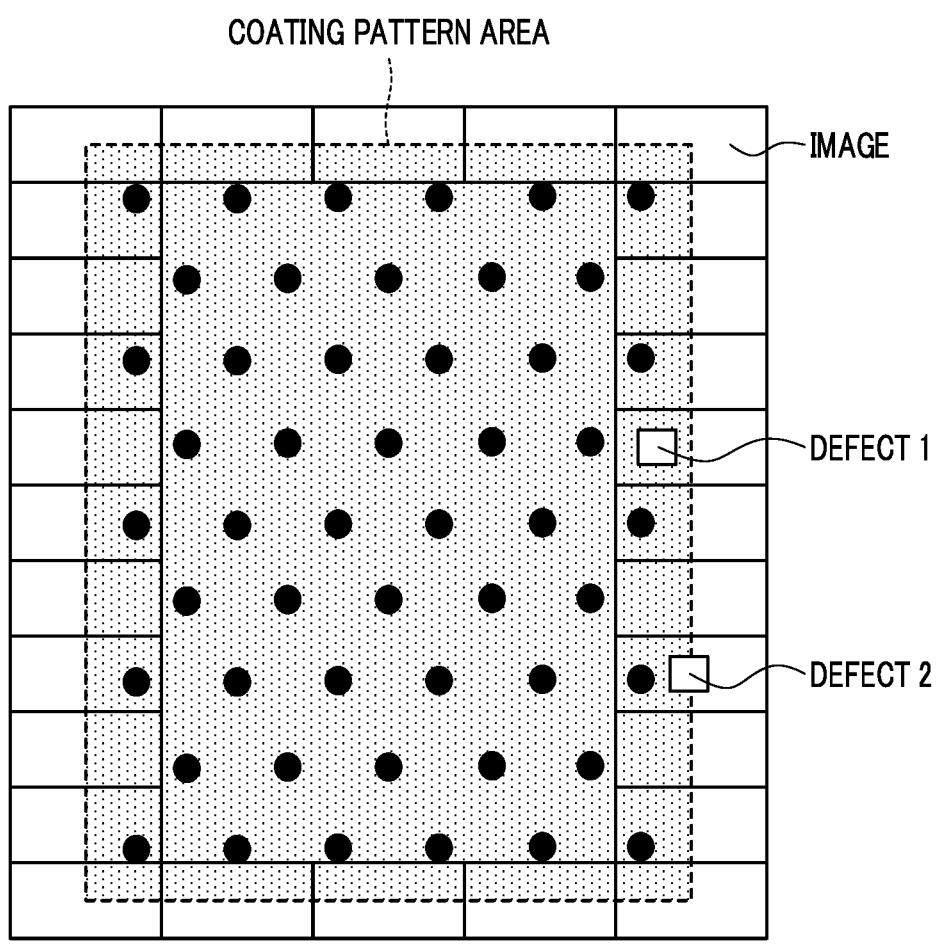
FIG. 10 is a diagram illustrating a display method when a plurality of pieces of inspection information are present on an outer circumference of a shot region according to Embodiment 2.

FIG. 9 is a diagram illustrating a case in which inspection information is analyzed and the analysis information and information including analysis information associated with the result of the imprint process as well are displayed at the same time, in addition to FIG. 7 illustrated in Embodiment 1. FIG. 10 is a diagram illustrating a case in which inspection information is analyzed and the analysis information and information including analysis information associated with the result of the imprint process as well are displayed at the same time, in addition to FIG. 8 illustrated in Embodiment 1. Here, the analysis information indicates, for example, defect information associated with a defect in the substrate W. Furthermore, Defect 1 in the defect information is an example in which an insufficient amount of liquid droplets of the imprint material R is provided and Defect 2 is an example in which a large amount of liquid droplets of the imprint material R is provided and a liquid droplet protrudes from a boundary in the substrate W.

Defect 1 is also referred to as an "unfilled defect." Furthermore, Defect 2 is also referred to as "effusion" from a pattern region. Therefore, the pieces of defect information indicate that an amount, a shape, an arrangement, a size, and the like of the imprint material R are outside of a predetermined range. That is to say, it shows that it is different from the initial assumption. In this embodiment, the editor DAE obtains information to be linked from the configuration information file. The information to be obtained is the coordinate information of the coating information RP, the coordinate information of the inspection information, and the coordinate information of the defect information.

Also, after positioning is performed on the basis of the coordinate information of the coating information RP, the coordinate information of the inspection information, and the coordinate information of the defect information, the positioning is reflected in the area 601 in the editor DAE. After that, the pieces of information are displayed on the monitor 201. When the pieces of information are displayed on the area 601 and the monitor 201, at least any one or more of the inspection information and the analysis information are displayed at the same time, in addition to the coating information RP. Furthermore, when the pieces of information are displayed in the area 601 at the same time, the pieces of information may be displayed while partially overlapping. In addition, the pieces of information may be displayed separately on the same screen, for example, may be displayed to be arranged side by side upward/downward or rightward/leftward.

Furthermore, another display apparatus may be prepared and displayed on each display apparatus or information to be displayed on each display apparatus may be arbitrarily combined and displayed. In addition, at least any two or more of the coating information RP, the inspection information, the analysis information, and the defect information may be displayed in the area 601 at the same time. Moreover, when the pieces of information are displayed at the same time as described above, the pieces of information may be displayed while partially overlapping or may be displayed separately on the same screen, for example, may be displayed to be arranged side by side upward downward or rightward/leftward.

Information obtained by analyzing a type, a size, a shape, and the like of a defect is displayed as the defect information. Furthermore the inspection information and a method of obtaining the inspection information are the same as those in Embodiment 1 and thus a description thereof will be omitted. In this way, when the defect information is also displayed at the same time, in addition to the coating information RP and the inspection information, it is possible to grasp a position and information of a defect with respect to the coating information RP when viewed in a bird's-eye view and it is possible to significantly reduce a work time for the user to adjust the coating information RP at the time of performing the next imprint process.

Embodiment 3

Figure 11:
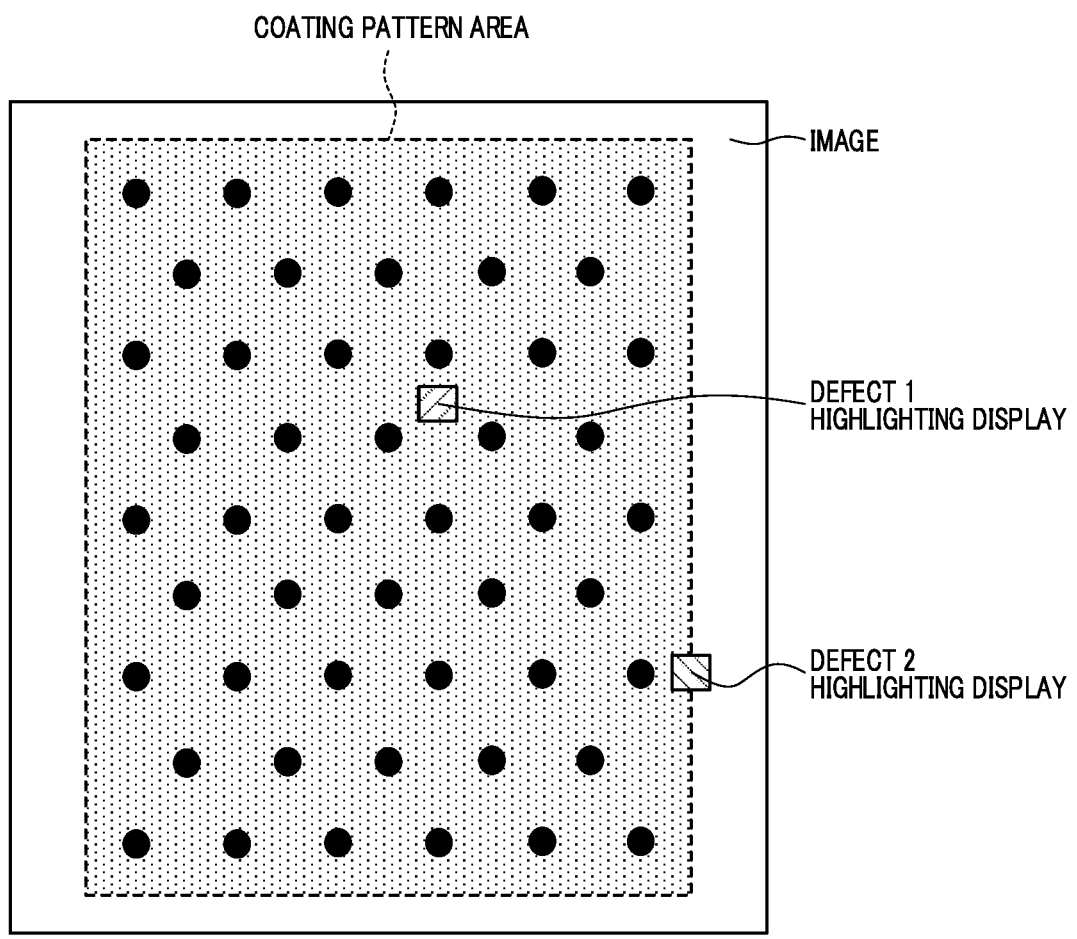
FIG. 11 is a diagram illustrating a display method when one piece of inspection information is present for the entire shot region according to Embodiment 3.
Figure 12:
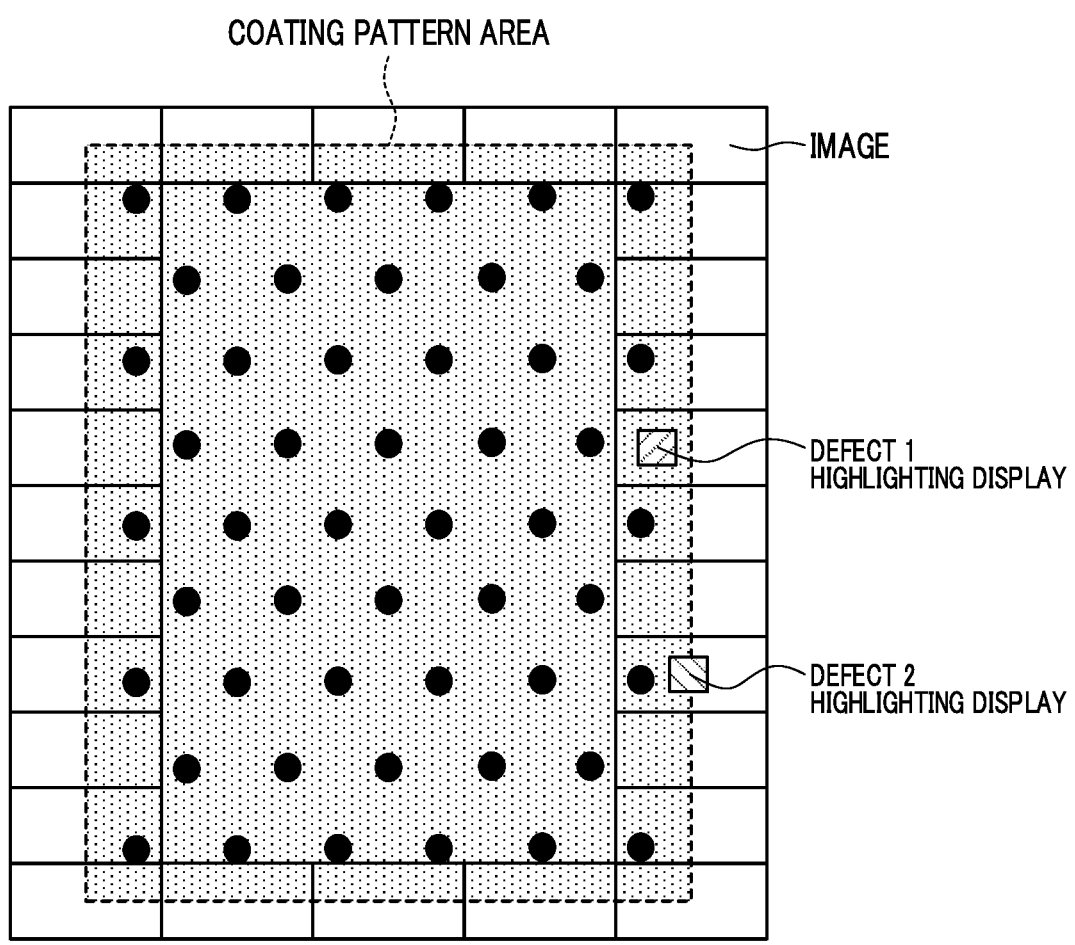
FIG. 12 is a diagram illustrating a display method when a plurality of pieces of inspection information are present on an outer circumference of a shot region according to Embodiment 3.

FIG. 11 is a diagram illustrating a case in which inspection information is analyzed and the analysis information and information including analysis information associated with the result of the imprint process as well are highlighted and displayed, in addition to FIG. 9 illustrated in Embodiment 2. FIG. 12 is a diagram illustrating a case in which inspection information is analyzed and the analysis information and information including analysis information associated with the result of the imprint process as well are highlighted and displayed, in addition to FIG. 10 illustrated in Embodiment 2. Here, the analysis information indicates, for example, defect information associated with a defect in the substrate W. In this embodiment, the editor DAE obtains the same information as in Embodiment 2 from the configuration information file to be linked and performs positioning in the same manner as in Embodiment 2. The pieces of information are reflected in the area 601 in the editor DAE. After that, the pieces of information are displayed on the monitor 201.

The display to be highlighted means that the coordinate information (a defect portion or a defect position) of the defect information is highlighted and displayed so that the coordinate information is conspicuous as, compared with places other than the defect portion. As the display to be highlighted, for example, there are a method in which the coordinate information of the defect portion in the defect information is colored and displayed and a method in which a frame is provided on or around the coordinate information and is colored and displayed. Furthermore, a display in which a pattern for coordinate information is used may be used. The pattern includes, for example, a pattern, and the like obtained by performing a hatching process in which coordinate information is surrounded by a frame, diagonal lines are drawn inside the frame, or dots are arranged at equal intervals. In addition, there is a method of highlighting and displaying a difference in brightness between coordinate information to defect portion) and the surroundings of the coordinate information (the defect portion).

Also, the method of performing displaying on the area 601 and the monitor 201 is the same as the display method in Embodiment 2 except that the defect information is highlighted and displayed and thus a description thereof will be omitted. Furthermore, the inspection information and the method of obtaining the inspection information are the same as those in Embodiment 1, the display of the defect information is the same as that in Embodiment 2, and thus a description thereof will be omitted. In this, way, when the defect information which has been highlighted is also displayed at the same time, in addition to the coating information RP and the inspection information, it is possible to grasp a position and information of a defect with respect to the coating information RP when viewed in a bird's-eye view. Therefore, it is possible to shorten a work time for the user to adjust the coating information RP at the time of performing the next imprint process.

Embodiment 4

Figure 13:
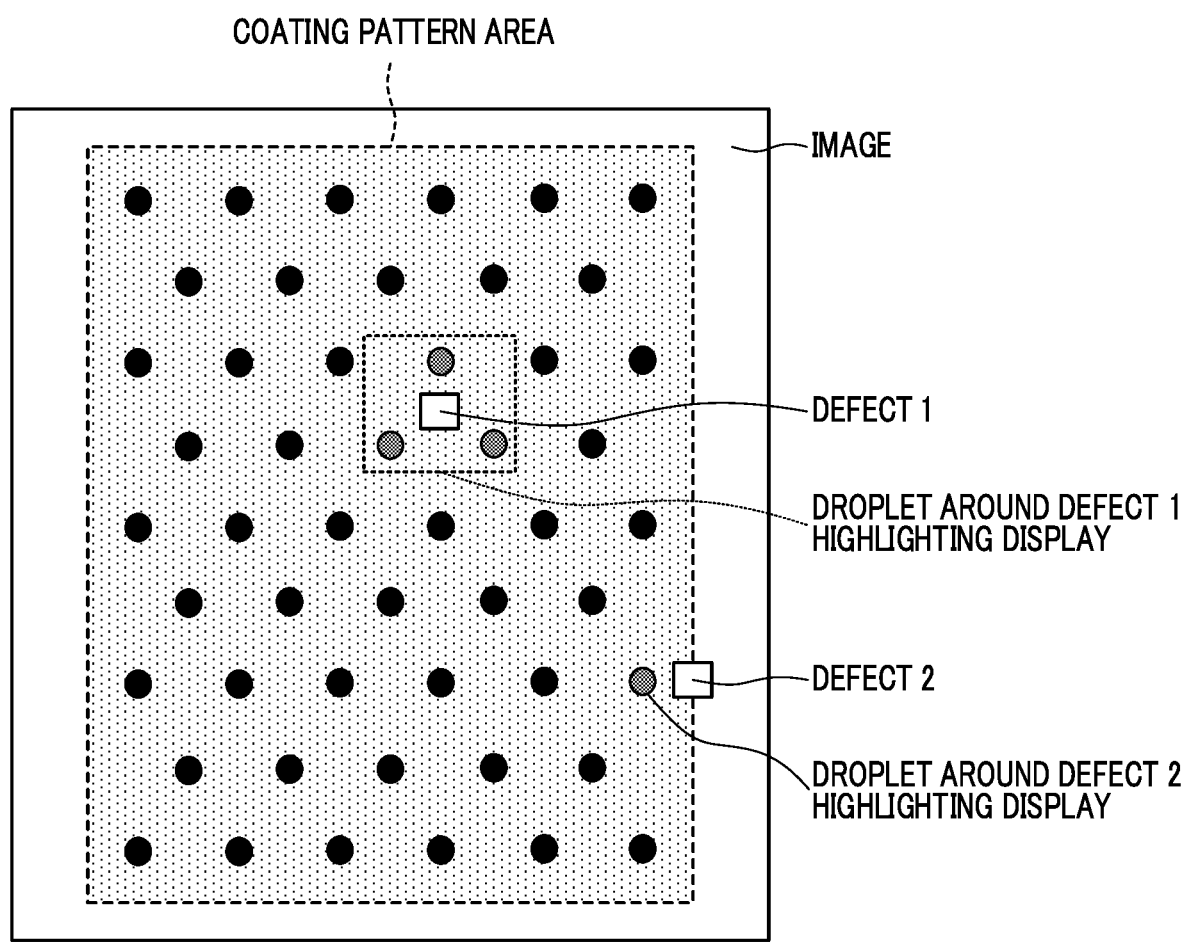
FIG. 13 is a diagram illustrating a display method when one piece of inspection information is present for the entire shot region according to Embodiment 4.
Figure 14:
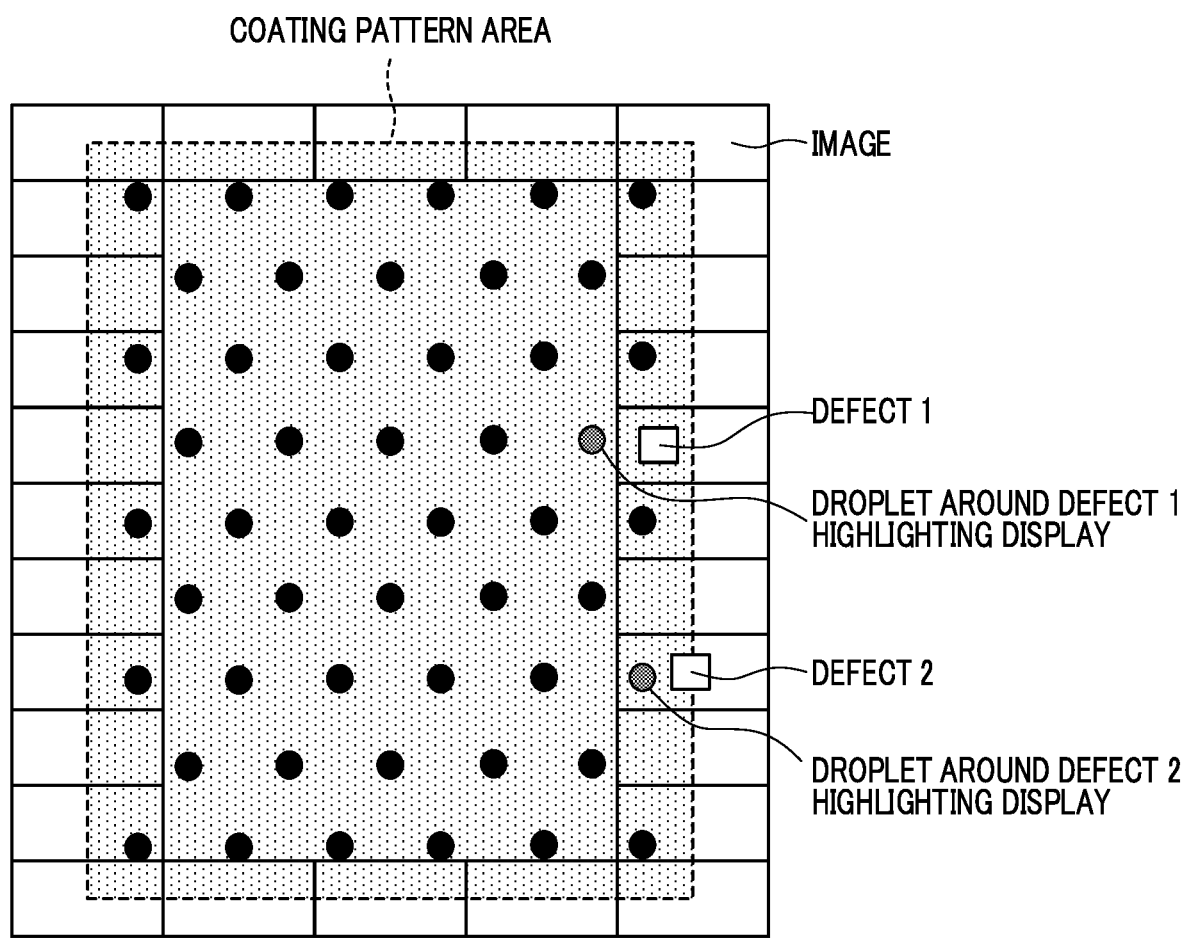
FIG. 14 is a diagram illustrating a display method when a plurality of pieces of inspection information are present on an outer circumference of a shot region according to Embodiment 4.

FIG. 13 is a diagram illustrating a case in which inspection information is analyzed and the analysis information and liquid droplets applied around the coordinates of analysis information associated with the result of the imprint process are highlighted and displayed, in addition, to FIG. 9 illustrated in Embodiment 2. FIG. 14 is a diagram illustrating a case in which inspection information is analyzed and liquid droplets applied around the coordinates of analysis information associated with the result of the imprint process are highlighted and displayed, in addition to FIG. 10 illustrated in Embodiment 2. Here, the analysis information indicates, for example, defect information associated with a defect in the substrate W.

In this embodiment, after the editor DAE obtains the same information as in Embodiment 2 from the configuration information file to be linked and performs positioning as in Embodiment 2, the pieces of information are reflected in the area 601 in the editor DAE. After that, the pieces of information are displayed on the monitor 201. As the display to be highlighted in this embodiment, there are a method in which liquid droplets around a defect portion (coordinate information) in the defect information are colored and displayed and a method in which a frame is provided around liquid droplets and the frame is colored and displayed.

Also, a display in which a pattern is used for liquid droplets may be used. The pattern includes, for example, a pattern and the like obtained by performing, a hatching process in which the liquid droplets are surrounded by a frame, diagonal lines are drawn inside the frame, or dots are arranged at equal intervals. Furthermore, there is a method of highlighting and displaying a difference in brightness between liquid droplets and the surroundings of the liquid droplets.

In addition, a method of performing displaying on the area 601 and the monitor 201 is the same as the display method in Embodiment 2 except that the liquid droplets around the coordinate information of the defect information are highlighted and displayed and thus a description thereof will be omitted.

Also, the inspection information and the method of obtaining the inspection information are the same as those in Embodiment 1, the display of the defect information is the same as that in Embodiment 2, and thus a description thereof will be omitted. In this way, it is possible to grasp a position and information of a defect with respect to the coating information RP when viewed in a bird's-eye view when liquid droplets around the defect information which has been highlighted and displayed are also displayed at the same time, in addition to the coating information RP and the inspection information and the defect information. Therefore, it is possible to significantly reduce a work time for the user to adjust the coating information RP at the time of performing the next imprint process.

Embodiment 5

Figure 15:
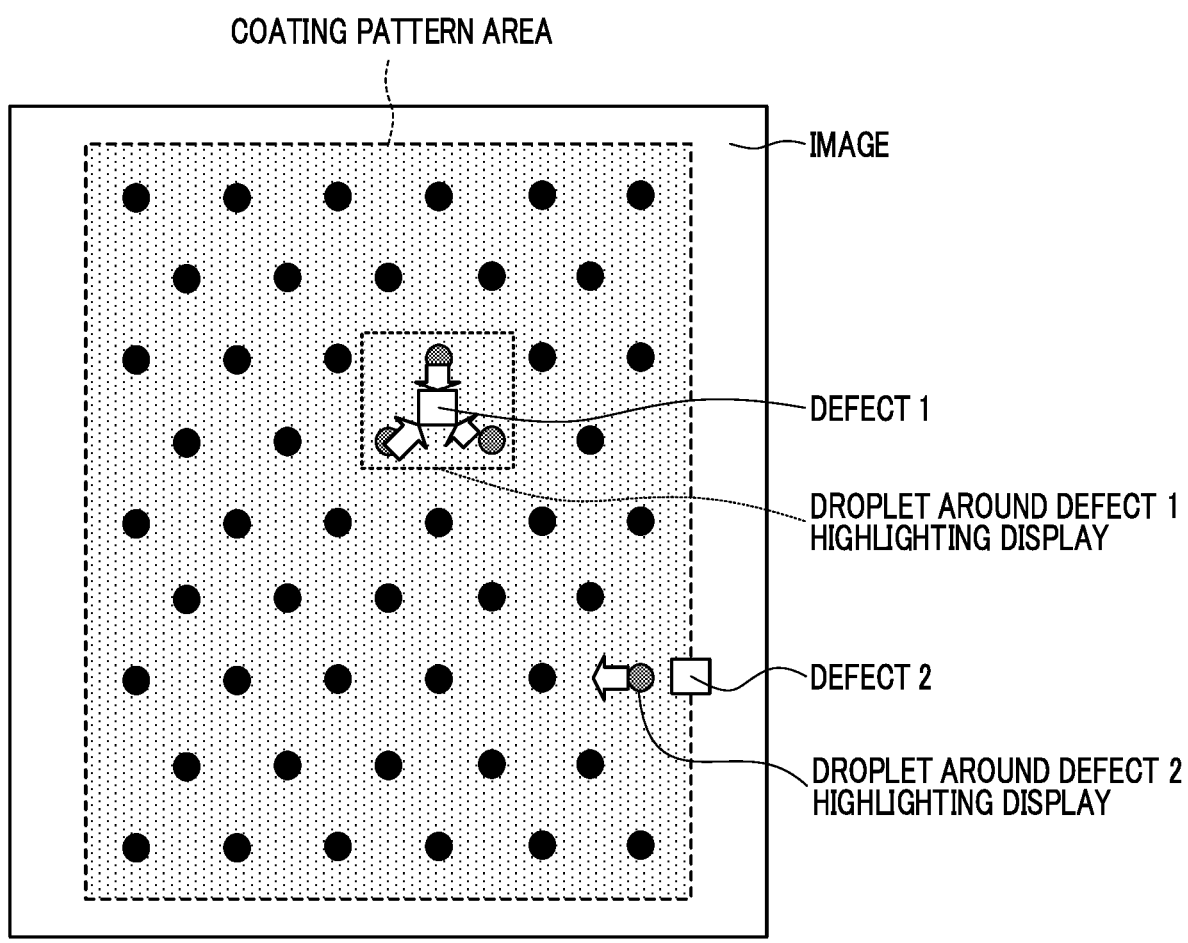
FIG. 15 is a diagram illustrating a display method when one piece of inspection information is present for the entire shot region according to Embodiment 5.
Figure 16:
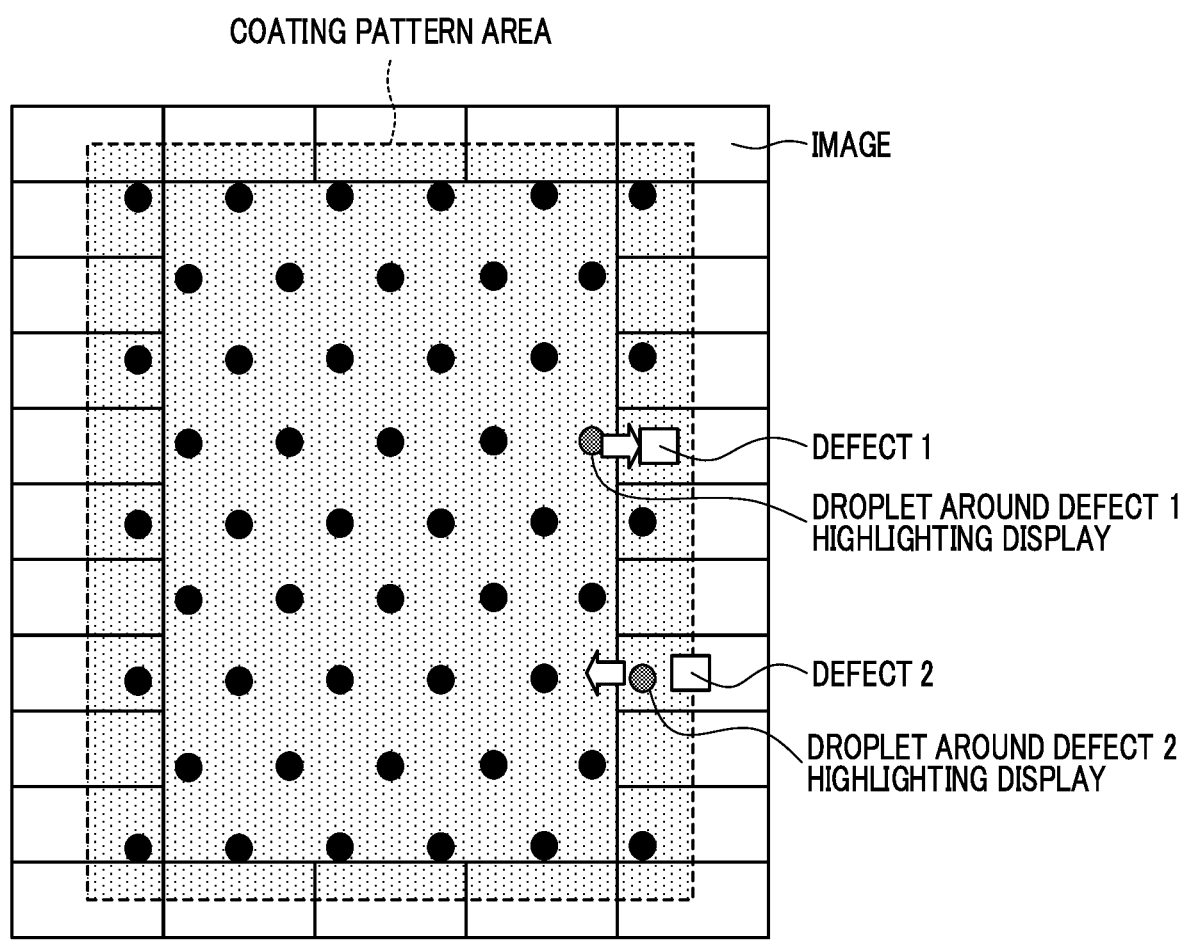
FIG. 16 is a diagram illustrating a display method when a plurality of pieces of inspection information are present on an outer circumference of a shot region according to Embodiment 5.

FIG. 15 is a diagram illustrating a case in which inspection information is analyzed, liquid droplets applied around the coordinates of analysis information associated with the result of the imprint process are highlighted and displayed and an arrow is also displayed, in addition to FIG. 11 illustrated in Embodiment 3. FIG. 16 is a diagram illustrating a case in Which inspection information is analyzed, liquid droplets applied around the coordinates of analysis information associated with the result of the imprint process are highlighted and displayed, and an arrow is also displayed, in addition to FIG. 12 illustrated in Embodiment 3.

Here, the analysis information indicates, for example, defect information associated With a defect in the substrate W. In this embodiment, after the editor DAE obtains the same information as in Embodiment 2 from the configuration information file to be linked and performs positioning as in Embodiment 2, the pieces of information are reflected in the area 601 in the editor DAE. After that, the pieces of information are displayed on the monitor 201. Although the display to be highlighted in this embodiment is the same as that in Embodiment 2, an arrow is also displayed around a liquid droplet. Although an example in which, when the coating information is adjusted, a desired moving direction of a liquid droplet to be adjusted is indicated using an arrow has been described above, the display method is not limited thereto.

Also, the method of performing displaying on the area 601 and the monitor 201 is the same as the display method in Embodiment 2 except that liquid droplets around the coordinate information of the defect information are highlighted and displayed and an arrow is displayed around the liquid droplets and thus a description thereof will be omitted. Furthermore, the inspection information and the method of obtaining the inspection information are the same as those in Embodiment 1 and the display of the defect information is the same as that in Embodiment 2. Thus, a description thereof will be omitted.

In this way, when the liquid droplets which has been highlighted and displayed around the defect information and the arrow displayed around the defect information are displayed at the same time, in addition to the coating information RP and the inspection information and the defect information, it is possible to grasp a position and information of a defect with respect to the coating information RP when viewed in a bird's-eye view. Therefore, it is possible to shorten a work time for the user to adjust the coating information RP at the time of performing the next imprint process.

Embodiment 6

Figure 17:
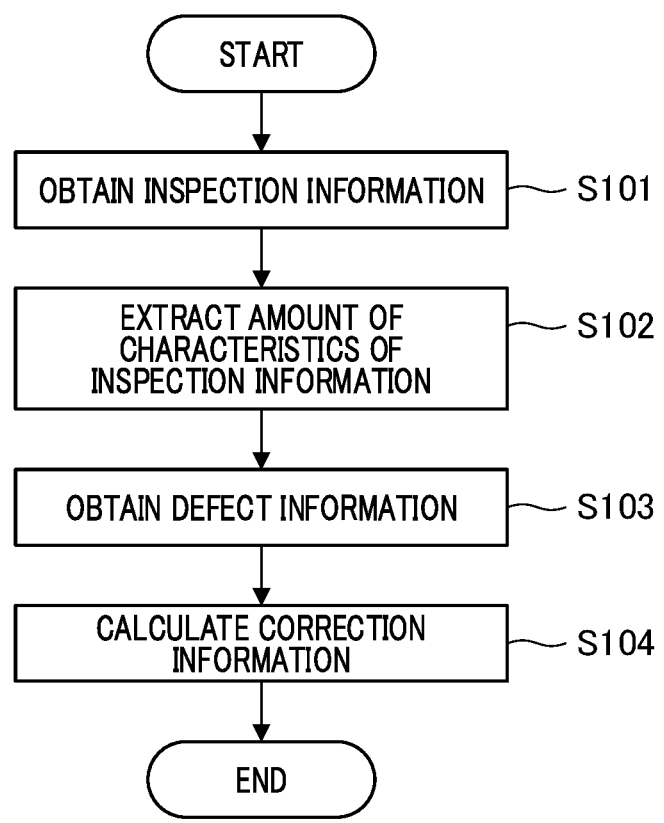
FIG. 17 is a flowchart for describing an example of a method of calculating correction data concerning coating information according to Embodiment 6.

FIG. 17 is a flowchart for describing correction information calculation of the coating information RP in this embodiment, which is executed by the controller CNT using a computer program as described above. In this embodiment, first, in Step S101, inspection information (inspection data) for inspection is obtained for the entire surface of the substrate W which has been subjected to the imprint process. Here, the inspection information is, for example, an image obtained by the imaging unit CAM and includes image information concerning the pattern P formed on the substrate which has been subjected to the imprint process.

When the inspection information in Step S101 is obtained, the controller CNT also functions as an obtaining unit. Subsequently, in Step S102, a characteristic (a characteristic amount) on the substrate W is extracted from the inspection information obtained in Step S101. Subsequently, analysis information associated with the result of the imprint process is obtained by analyzing a characteristic amount or the like of the inspection information and the inspection information obtained in Step S103. Here, the analysis information is for example, defect information associated with a defect in the substrate which has been subjected to the imprint process. When the analysis information in Step S102 is obtained, the controller CNT also functions as an analysis unit.

In an analysis step in Step S103, defect information is obtained by analyzing a defect type, a size, a shape, a position, and the like using the inspection information. Subsequently, in Step S104, correction information for correcting the coating information RP is calculated on the basis of the analysis information (the defect information) obtained in Step S103. It is possible to significantly reduce a work time for the user to adjust the coating information RP at the time of performing the next imprint process using the calculated correction information. Furthermore, in addition to the coating information RP, a step of displaying the obtained or calculated information on the monitor 601 of the editor DAE at the same time may be provided as described above. In addition, in this step, the controller CT also functions as a display control unit. These pieces of information are also displayed on the monitor 201 which is a display apparatus. Moreover, although this embodiment is implemented using a flowchart, this embodiment may be implemented using a discrete circuit or the like.

Embodiment 7

Figure 18:
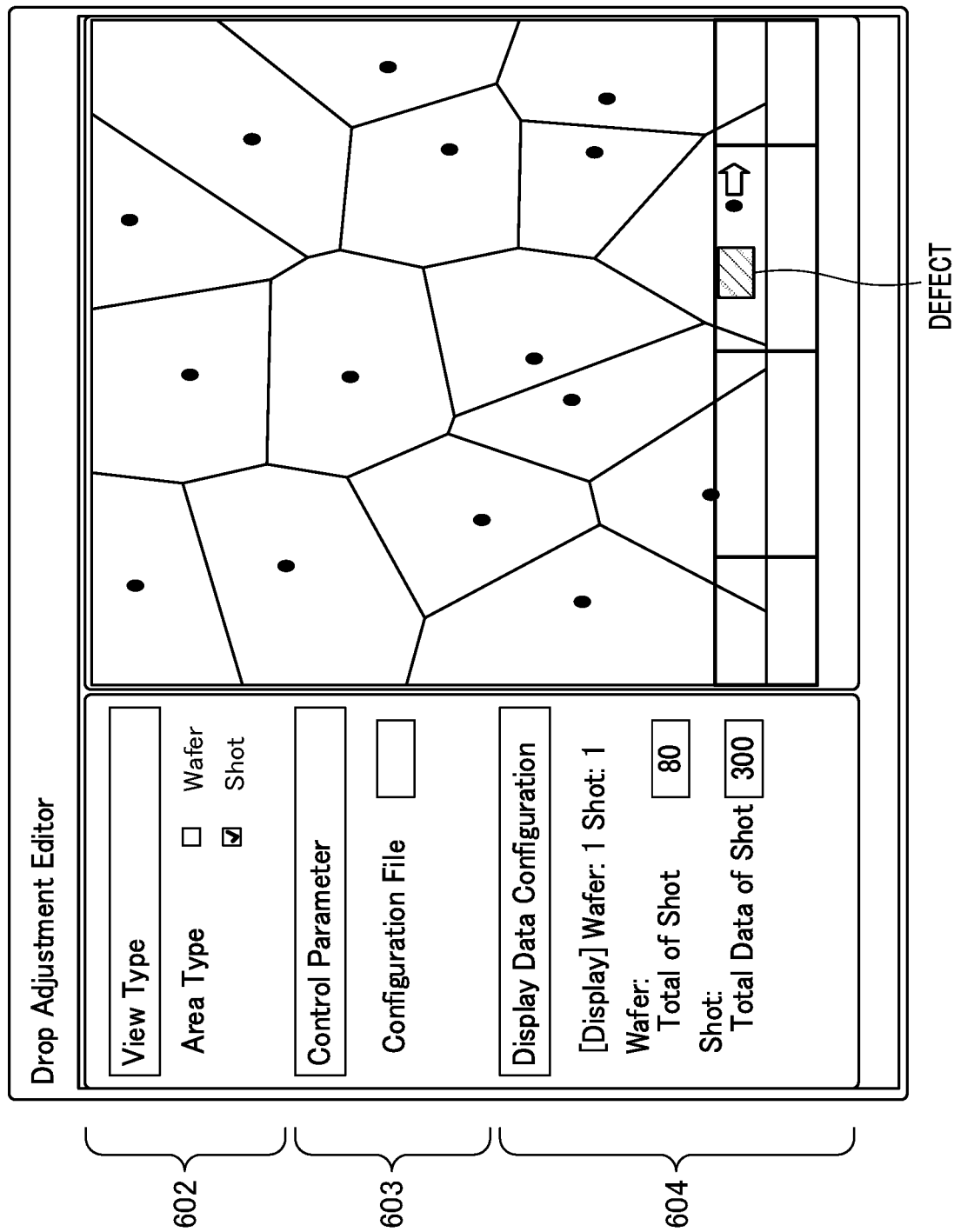
FIG. 18 is a diagram of an example of a diagram illustrating a spread state of liquid droplets displayed in an editor according to Embodiment 7.

FIG. 18 is a diagram illustrating a spread stat of liquid droplets on a screen of the editor DAE. This embodiment is characterized in that a spread state of the liquid droplets is shown using a Voronoi diagram, instead of the inspection information. Here, the Voronoi diagram is a diagram in which a region is divided in accordance with the details of a generic point to which other points on the same metric space are closer with respect a plurality of points (generic points) arranged at arbitrary positions in a certain metric space.

Also, in this embodiment, the editor DAE obtains the same information as in Embodiment 2 from the linked configuration information file, performs positioning in the same manner as in Embodiment 2, reflects the information in the area 601 in the editor DAE, and then displays the information on the monitor 201.

The display method of highlighting the defect portion is the same as its Embodiment 3 and the method of displaying an arrow around liquid droplets is the sane as in Embodiment 5. Thus, a description thereof will be omitted. Although the Voronoi diagram has been used for showing the spread state of the liquid droplets in this embodiment, the spread state of the liquid droplets varies in accordance with an amount of liquids of the liquid droplets and a direction of a for applied to the quid droplets. Thus, a diagram obtained by reflecting these calculation results may be created and displayed. Furthermore, a diagram obtained by displaying the spread of the liquid droplet as a concentric circle using a center of the liquid droplet as a generic point may be created.

Alternatively, a diagram obtained by creating the spread of the liquid drop is created using an expression such as contour lines in a map. In this way, in addition to the Voronoi diagram, the inspection information, and the defect information, when a liquid droplet around the defect information highlighted and displayed and an arrow applied around the defect information are displayed on the monitor 201 at the same time, it is possible to grasp a position and information of a defect with respect to the coating information RP when viewed in a bird's-eye view. Therefore, it is possible to significantly reduce a work time for the user to adjust the coating information RP at the time of performing the next imprint process.

Embodiment 8

Figure 19:
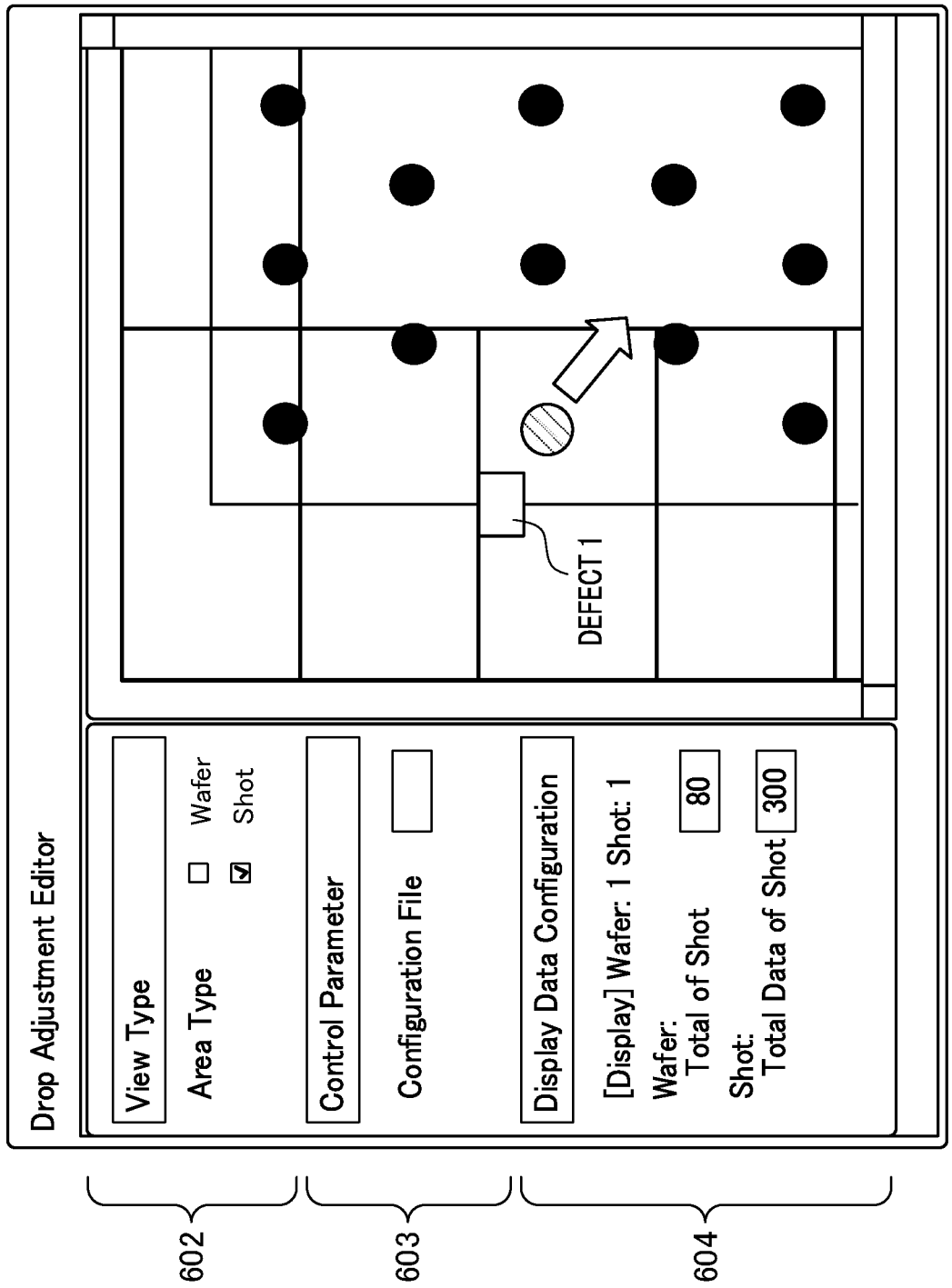
FIG. 19 is a diagram illustrating an example of an editor according to Embodiment 8.

FIG. 19 is an enlarged view of the information, displayed on the editor DAE. In this embodiment, the editor DAE obtains the same information as in Embodiment 2 from the linked configuration information file, performs positioning in the same manner as in Embodiment 2, reflects the information in the area 601 in the editor DAE, and then displays the information on the monitor 201. The display method of highlighting the defect portion is the same as in Embodiment 3 and the method of displaying an arrow around liquid droplets is the same as in Embodiment 5. Thus a description thereof will be omitted.

In this embodiment, enlargement or reduction is performed through an operation using the input device 202 or the keyboard, screen scrolling, or the like. Furthermore, in this embodiment, in addition to the coating information RP, at least one or more of the inspection information and the analysis information is displayed in the area 601 at the same time. Furthermore, when any one of these pieces of information displayed in the area 601 is displayed in a screen of the area 601 in an enlarged or reduced manner, this embodiment is characterized in that enlargement or reduction is performed in conjunction with other pieces of information to be displayed as well. At least two or more of the coating information RP, the inspection information, the analysis information, and the correction information may be displayed in the area 601 at the same time.

Also, when any one of these pieces of information displayed in the area 601 is displayed in a screen in the area 601 in an enlarged or reduced manner, enlargement or reduction may be performed in conjunction with other pieces of information to be displayed as well. In this way, when enlargement or reduction is performed so that other pieces of information are linked to one piece of information to be displayed in the editor DAE, it is possible to easily grasp other pieces of information as well including the defect information. Therefore, it is possible to significantly reduce a work time for the user to adjust the coating information RP at the time of performing the next imprint process.

Embodiment 9

Figure 20:
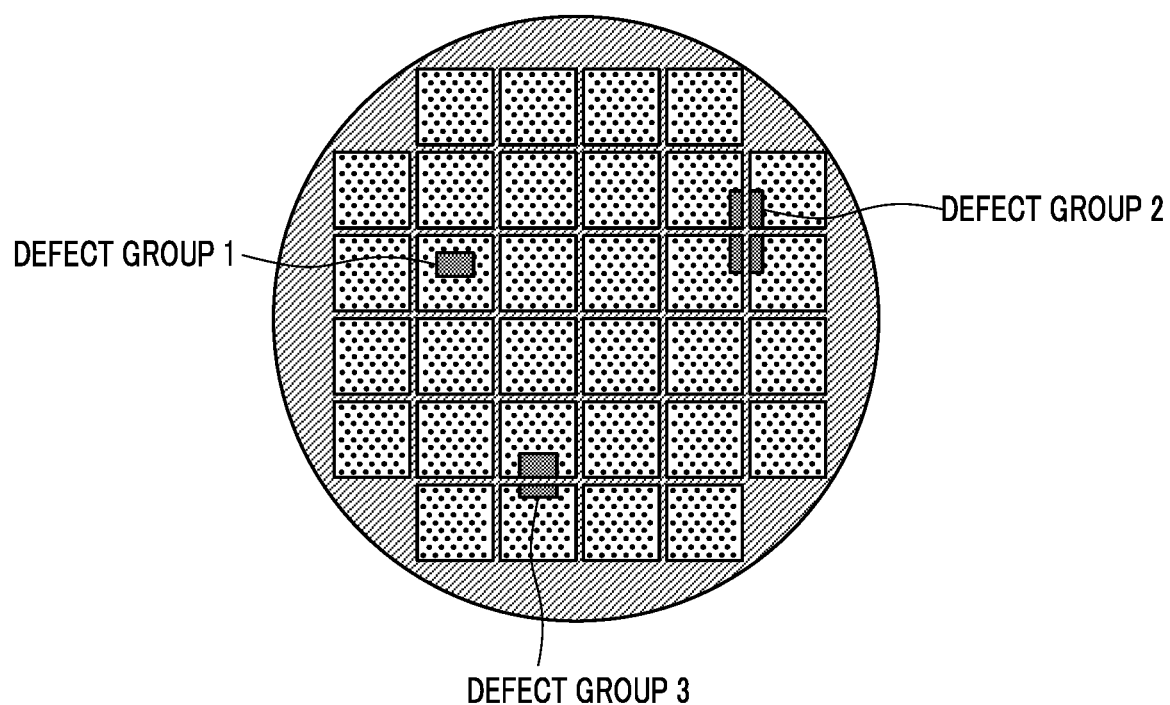
FIG. 20 is a diagram illustrating an example of a method of displaying the entire substrate and analysis information concerning the entire substrate according to Embodiment 9.

FIG. 20 is a diagram in which the entire substrate is displayed and the analysis information regarding the entire substrate are also displayed at the same time. Here, the analysis information is, for example, defect information associated with the defect in the substrate which has been subjected to the imprint process. In this embodiment, the editor DAE obtains the same information as in Embodiment 2 from the linked configuration information file, performs positioning as in Embodiment 2, and then displays the entire substrate and the defect information. The display method of highlighting the detect portion is the same as in Embodiment 3. Thus, a description thereof will be omitted.

This embodiment is characterized by displaying defect information on the entire substrate. The defect information is characterized in that the displaying is performed by performing highlighting and displaying as in Embodiment 3, a plurality of pieces of defect information are set as one group when the plurality of pieces of defect information are present, and the displaying is performed. Furthermore, a group of pieces of defect information may be colored or may be surrounded by a frame of highlighting. In addition, the frame may be colored, diagonal lines may be provided inside the frame, or a pattern such as a hatching process in which points are arranged at equal intervals may be used.

Also, the display color or pattern of the group of pieces, of defect information to be highlighted may be changed and displayed for each group in accordance with the number of defect information belonging to the group. For example, it is also possible to set an arbitrary number, provide layers such as a small, medium, and large layer on the basis of the set number, and change the color of a group belonging to the layer. Furthermore, the displaying may be performed in a group using a color classification and a pattern as described above in accordance with the type of defect information belonging to one group.

This embodiment is not limited thereto, the user may allow the user to manually make any settings. In addition, a plurality of highlighting displays as described above may be set as defaults, the type of highlighting, for example, highlighting in which the above-described colors and patterns are set may be switched. Furthermore, a display method in which densities of colors of, for example, a place having a larger number of pieces of defect information in a group, such as an image in which thermography are changed is used, may be used. Thus, it is possible to grasp a position and information of the defect information in the entire substrate when viewed in a bird's-eye view and it is possible to significantly reduce a work time for the user to adjust the coating information RP at the time of performing the next imprint process.

Embodiment 10

Figure 21:
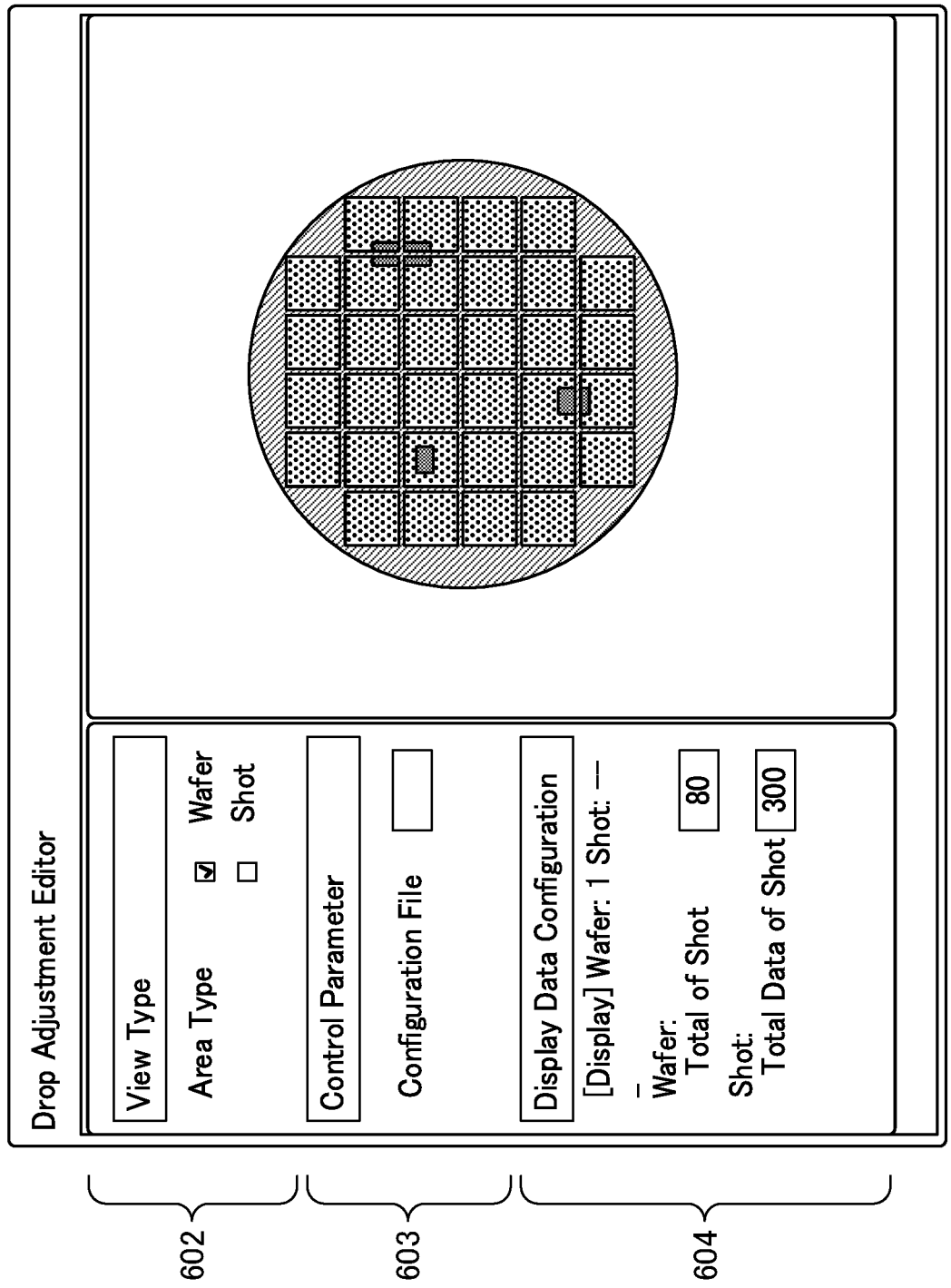
FIG. 21 is a diagram illustrating an example of an editor according to Embodiment 10.

FIG. 21 is a diagram illustrating FIG. 20 illustrated in Embodiment 9 displayed in the editor DAE. The editor DAE obtains the same information as in Embodiment 3 from the linked configuration information file, performs positioning in the same manner as in Embodiment 3, reflects the entire substrate and the defect information in the area 601 in the editor DAE, and then displays the information on the monitor 201. Furthermore, the area 604 illustrated in FIG. 21 displays information obtained from the configuration information file. This embodiment is characterized in that at least one display position of the coating information, the inspection information, and the analysis information displayed in the screen can be switched in conjunction with the display of the entire substrate W or a shot region.

In this embodiment, first, when the information concerning the substrate W is included in the configuration information file, the function of this embodiment is enabled, reflected in the area 601 on the editor DAE, and then displayed on the monitor 201. The display of the substrate W is performed by selecting a switching command of the substrate W in a display method setting area of the area 602 of the editor DAE.

When switching to a shot region is desired to be performed, the switching is performed by selecting a shot region switching command in a display method setting area of the area 602 in the editor DAE. The shot region to be displayed may be the shot region set as a default or the shot region displayed at the time of the previous operation.

Also, the switching to the selected shot region may be performed by selecting an arbitrary position on the substrate W. Furthermore, the shot regions included in the substrate W are numbered, for example, so that each number can be selected. Moreover, the selected shot region may be displayed in the area 601. In this way, when a function of switching the display is provided, it is possible to grasp the position and information of the defect information when viewed in a bird's-eye view. In addition, it is possible to significantly reduce a work time for the user to adjust the coating information RP at the time of performing the next imprint process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Also, a computer program which implements a part or all of the control in this embodiment to implement the functions of the above-described embodiments may be supplied to the imprint apparatus or the like via a network or various storage media. Furthermore, a computer or a CPU, an MPU, or the like) in the imprint apparatus or the like may read out and execute a program. In this case, the program and the storage medium storing the pro ram constitute the present invention.

This application claims the benefit of Japanese Patent Application No. 2019-187550 filed on Oct. 11, 2019, which is herby incorporated by reference herein in its entirety.

What is claimed is:

1. An information processing system comprising:
an imprint apparatus configured to:
supply imprint material on a substrate via a dispenser; and
bringing a mold into contact with the imprint material supplied to the substrate to form a pattern on the imprint material; and
an information processing apparatus including:
at least one processor or circuit which functions as:
an obtaining unit configured to obtain inspection information regarding a result of an inspection of the substrate which has been subjected to the imprint process;
an analysis unit configured to analyze the inspection information and obtain analysis information associated with the result of the imprint process; and
a display control unit configured to display at least any of the inspection information and the analysis information on a screen of a display apparatus at the same time with the coating information.

2. The information processing system according to claim 1, wherein the display control unit causes at least any of the inspection information and the analysis information to partially overlap and to be displayed on the screen at the same time with the coating information.

3. The information processing system according to claim 1, wherein in a case where the display control unit selects an arbitrary position of the substrate displayed on the screen, the display control unit accordingly changes display positions of the coating information and at least any of the inspection information and the analysis information on the screen.

4. The information processing system according to claim 1, wherein, in a state in which at least any of the inspection information and the analysis information is displayed on the screen using the display control unit, in addition to the coating information, in a case where a magnification of any one of the pieces of information displayed on the screen is changed, the display control unit accordingly changes a magnification of the rest of the other pieces of information displayed on the screen.

5. The information processing system according to claim 1, wherein the obtaining unit obtains the inspection information from a storage unit which stores inspection information or from an inspection apparatus configured to inspect the substrate which has been subjected to the imprint process.

6. The information processing system according to claim 1, wherein the inspection information includes image information regarding the pattern formed on the substrate by the imprint process.

7. The information processing system according to claim 6, wherein the analysis unit generates information indicating filling of a pattern section of the mold with the imprint material, as the analysis information, on the basis of the image information.

8. The information processing system according to claim 1, wherein the analysis information includes defect information associated with a defect in the substrate which has been subjected to the imprint process.

9. The information processing system according to claim 8, wherein the defect information includes information concerning a place in which an amount of the imprint material in the pattern formed on the substrate which has been subjected to the imprint process is outside of a predetermined range.

10. The information processing system according to claim 8, wherein the defect portion in the defect information is displayed on the screen at the same time as the coating information, and wherein the defect portion is differently displayed from places other than the defect portion.

11. The information processing system according to claim 10, wherein the defect portion is differently displayed by using at least one of a predetermined color, a predetermined frame, a predetermined pattern, a predetermined brightness, and a predetermined indicator.

12. The information processing system according to claim 1, further comprising a calculation unit configured to calculate correction information for correcting the coating information, and wherein the display control unit causes at least any of the inspection information, the analysis information, and the correction information to be displayed on the screen at the same time with the coating information.

13. The information processing system according to claim 1, further comprising:
a configuration information file configured to associate the coating information, the inspection information, and the analysis information.

14. An information processing system comprising:
an imprint apparatus configured to:
supply imprint material on a substrate via a dispenser; and
bringing a mold into contact with the imprint material supplied to the substrate to form a pattern on the imprint material; and
an information processing apparatus including:
at least one processor or circuit which functions as:
an obtaining unit configured to obtain inspection information regarding a result of an inspection of the substrate which has been subjected to the imprint process;
an analysis unit configured to analyze the inspection information and obtain analysis information associated with the result of the imprint process; and
a generation unit configured to generate a configuration information file for associating at least any of the inspection information and the analysis information with the coating information.

15. The information processing system according to claim 14, wherein the configuration information file includes information on coordinates of the inspection information and information on coordinates of the analysis information.

16. An information processing method for an imprint apparatus, comprising:
supplying imprint material on a substrate via a dispenser;
bringing a mold into contact with the imprint material supplied to the substrate to form a pattern on the imprint material;
obtaining inspection information regarding a result of an inspection of the substrate which has been subjected to the imprint process;
analyzing the inspection information and obtaining analysis information associated with the result of the imprint process; and
displaying at least any of the inspection information and the analysis information on a screen of a display apparatus at the same time with the coating information.

17. An information processing method for an imprint apparatus comprising:
supplying imprint material on a substrate via a dispenser;
bringing a mold into contact with the imprint material supplied to the substrate to form a pattern on the imprint material;
obtaining inspection information regarding a result of an inspection of the substrate which has been subjected to the imprint process;
analyzing the inspection information and obtaining analysis information associated with the result of the imprint process; and
generating a configuration information file for associating at least any of the inspection information and the analysis information with the coating information.

18. The information processing method according to claim 17, wherein the configuration information file includes information on coordinates of the inspection information and information on coordinates of the analysis information.

19. A non-transitory computer-readable storage medium that stores a computer program for
an information processing system,
wherein the program is for executing the following steps:
a supplying step of supplying imprint material on a substrate via a dispenser;
a contacting step of bringing a mold into contact with the imprint material supplied to the substrate to form a pattern on the imprint material;
an obtaining step of obtaining inspection information regarding a result of an inspection of the substrate which has been subjected to the imprint process;

an analysis step of analyzing the inspection information and obtaining analysis information associated with the result of the imprint process; and a displaying step of displaying at least any of the inspection information and the analysis information on a screen of a display apparatus at the same time with the coating information.

20. A non-transitory computer-readable storage medium that stores a computer program for an information processing system wherein the program is for executing the following steps:

a supplying step of supplying imprint material on a substrate via a dispenser;

a contacting step of bringing a mold into contact with the imprint material supplied to the substrate to form a pattern on the imprint material;

an obtaining step of obtaining inspection information regarding a result of an inspection of the substrate which has been subjected to the imprint process;

an analysis step of analyzing the inspection information and obtaining analysis information associated with the result of the imprint process; and a generation step of generating a configuration information file for associating at least any of the inspection information and the analysis information with the coating information.

* * * * *